US012349597B2

(12) United States Patent
Van Der Straten et al.

(10) Patent No.: US 12,349,597 B2
(45) Date of Patent: Jul. 1, 2025

(54) CONICAL MAGNETIC RANDOM ACCESS MEMORY PILLAR STRUCTURES

(71) Applicant: INTERNATIONAL BUSINESS MACHINES CORPORATION, Armonk, NY (US)

(72) Inventors: Oscar Van Der Straten, Guilderland Center, NY (US); Koichi Motoyama, Clifton Park, NY (US); Joseph F Maniscalco, Greenville, SC (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 736 days.

(21) Appl. No.: 17/449,000

(22) Filed: Sep. 27, 2021

(65) Prior Publication Data

US 2023/0109291 A1    Apr. 6, 2023

(51) Int. Cl.
*H10N 50/01* (2023.01)
*H10B 61/00* (2023.01)
*H10N 50/80* (2023.01)

(52) U.S. Cl.
CPC ............ *H10N 50/01* (2023.02); *H10B 61/00* (2023.02); *H10N 50/80* (2023.02)

(58) Field of Classification Search
None
See application file for complete search history.

(56) References Cited

U.S. PATENT DOCUMENTS

| | | | |
|---|---|---|---|
| 7,211,849 B2 | 5/2007 | Hineman et al. | |
| 8,455,965 B2 | 6/2013 | Li et al. | |
| 8,644,063 B2 | 2/2014 | Li et al. | |
| 8,962,493 B2 | 2/2015 | Levi et al. | |
| 9,406,876 B2 | 8/2016 | Pinarbasi | |
| 9,490,424 B2 | 11/2016 | Lu | |
| 10,566,526 B1 | 2/2020 | Liu et al. | |
| 10,593,728 B1 | 3/2020 | Hsieh et al. | |
| 10,608,174 B2 | 3/2020 | Li et al. | |
| 10,720,567 B2 | 7/2020 | Briggs et al. | |
| 10,741,752 B2 | 8/2020 | Annunziata et al. | |
| 10,770,652 B2 | 9/2020 | Marchack et al. | |
| 10,797,228 B2 | 10/2020 | Kim et al. | |
| 10,811,594 B2 | 10/2020 | Shrivastava et al. | |
| 10,840,441 B2 | 11/2020 | Annunziata et al. | |
| 10,886,461 B2 | 1/2021 | Yang et al. | |
| 2015/0056722 A1 | 2/2015 | Li et al. | |
| 2016/0163973 A1* | 6/2016 | Pinarbasi | H10N 50/80 438/3 |
| 2016/0254446 A1* | 9/2016 | Lu | H10N 50/01 438/3 |
| 2019/0348602 A1* | 11/2019 | Li | H10N 50/01 |
| 2020/0098977 A1* | 3/2020 | Kim | H10B 61/22 |
| 2020/0220072 A1* | 7/2020 | Marchack | H10B 61/00 |
| 2020/0343443 A1 | 10/2020 | Yang et al. | |

* cited by examiner

*Primary Examiner* — Bo B Jang
(74) *Attorney, Agent, or Firm* — Jeffrey M. Ingalls

(57) ABSTRACT

An MRAM device is provided. The MRAM device includes a first electrode, an MRAM stack formed on the first electrode, a hardmask structure formed on the MRAM stack, and a second electrode formed on the hardmask structure. A width of an upper portion of the hardmask structure is less than a width of the MRAM stack.

25 Claims, 14 Drawing Sheets

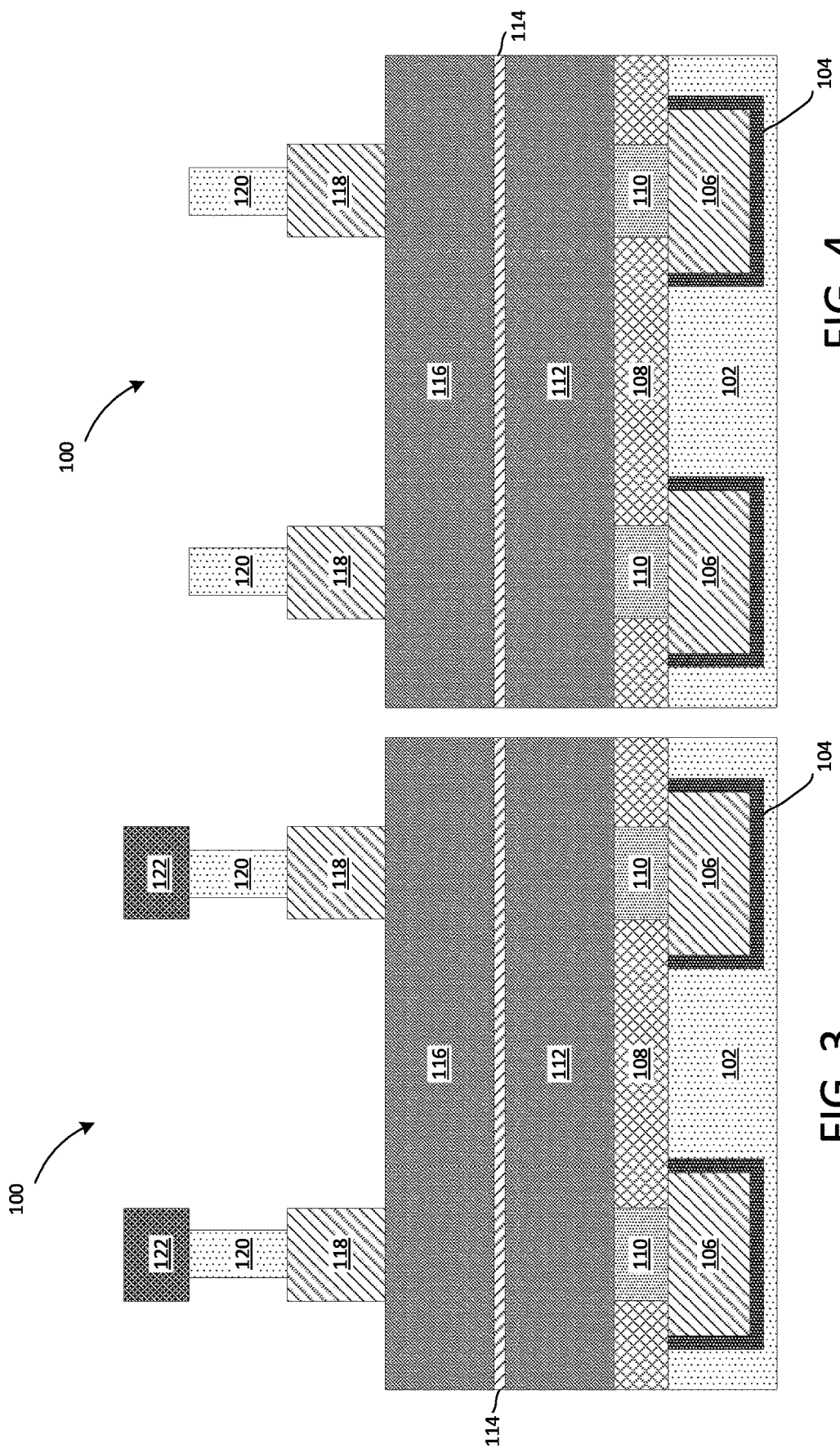

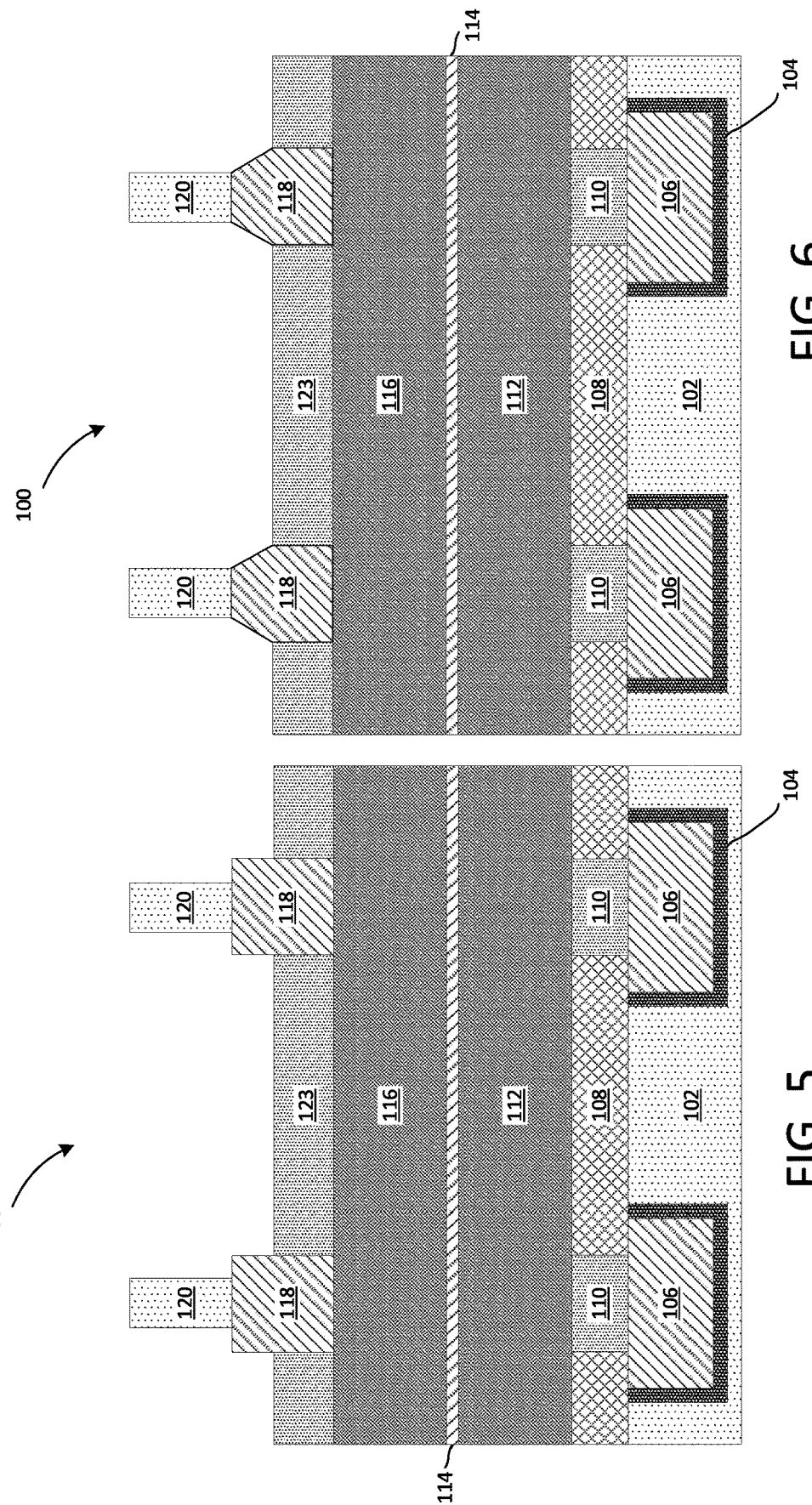

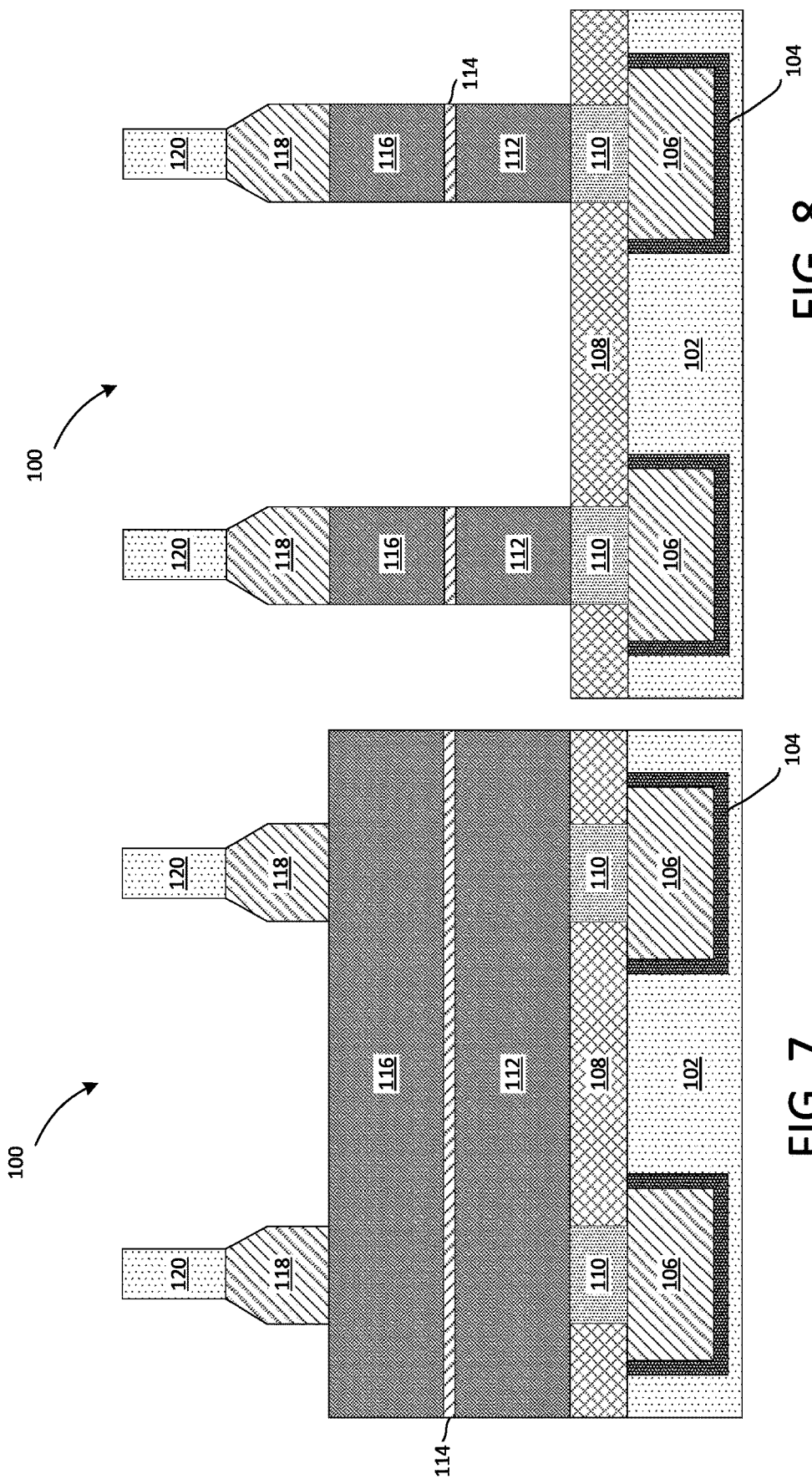

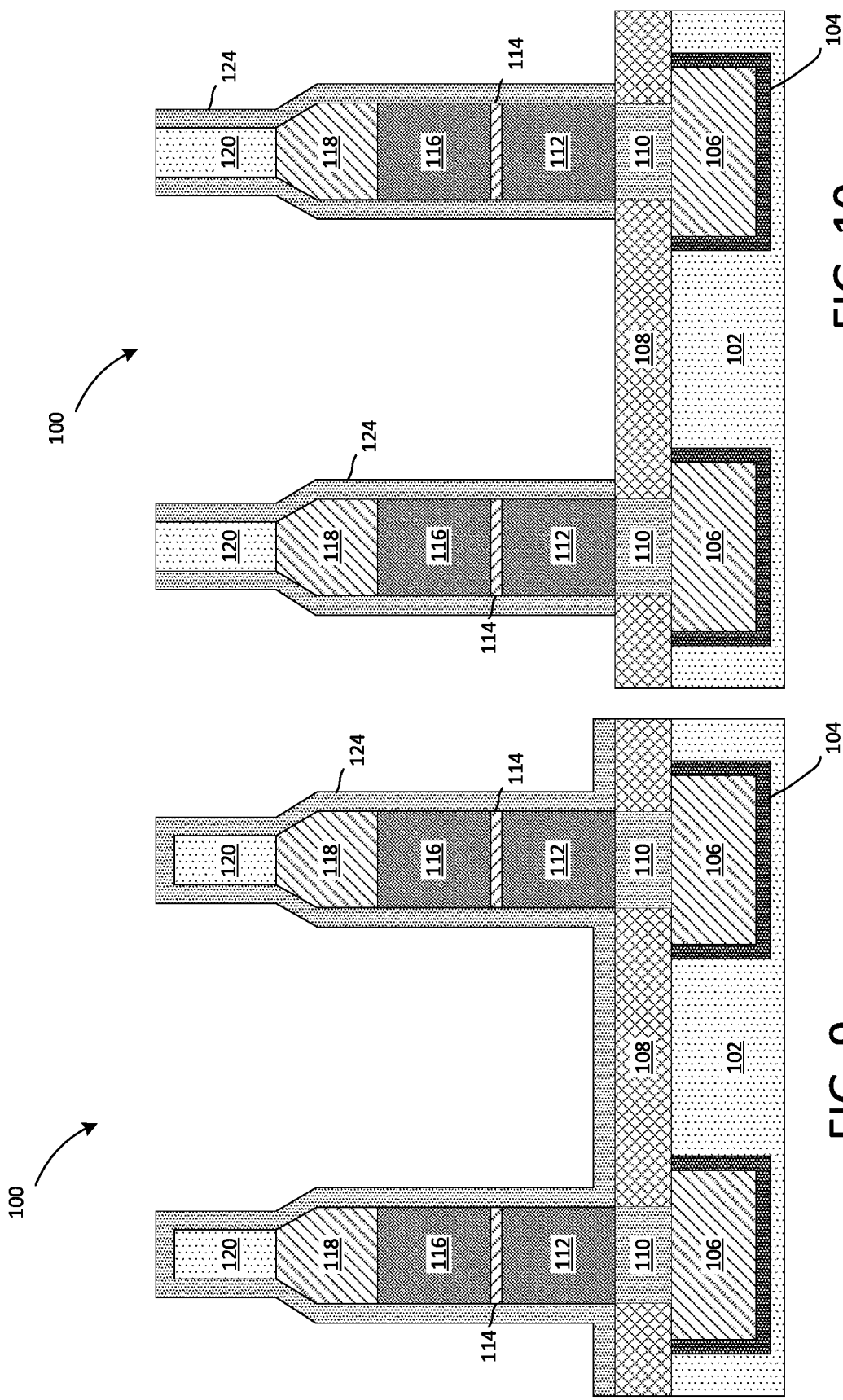

CONICAL MAGNETIC RANDOM ACCESS MEMORY PILLAR STRUCTURES

BACKGROUND

The present disclosure relates to magnetic random access memory (MRAM) devices based on perpendicular magnetic tunnel junction (MTJ) structures. Certain MRAM devices may be fabricated to include a bottom electrode, an MRAM stack, and a top electrode. In general, MRAM devices may be used in a variety of applications. One example application is embedded storage (e.g., eFlash replacement). Another example is cache (e.g., embedded dynamic random-access memory (eDRAM), or static random-access memory (SRAM)). Certain MTJ structures include a Co-based synthetic anti-ferromagnet (SAF), a CoFeB-based reference layer, a MgO-based tunnel barrier, a CoFeB-based free layer, and cap layers containing, for example, Ta and/or Ru. Embedded MTJ structures are usually formed by subtractive patterning of blanket MTJ stacks into pillars between two metal levels. It may be desirable to minimize or eliminate electrical shorting between adjacent MTJ stacks.

SUMMARY

Embodiments of the present disclosure relate to a method of manufacturing an MRAM device. The method includes forming a first electrode, forming an MRAM stack on the first electrode, forming a hardmask structure on the MRAM stack, and forming a second electrode on the hardmask structure. A width of an upper portion of the hardmask structure is less than a width of the MRAM stack. According to certain embodiments, a wider opening between adjacent MRAM devices owing to the lesser width of the upper portion of the hardmask structure may allow for void free ILD deposition therebetween.

In certain embodiments, the method may further include forming an interlayer dielectric (ILD) layer around the MRAM stack and the hardmask structure. As discussed above, the ILD layer may be deposited without voids.

In certain embodiments, the hardmask structure may include a first hardmask layer comprising a first material composition, and a second hardmask layer formed on the first hardmask layer and comprising a second material composition, the first material composition being different than the second material composition. In embodiments, the second hardmask layer has a width that is less than that of the first hardmask layer. According to certain embodiments, a wider opening between adjacent MRAM devices owing to the lesser width of the second hardmask layer relative to a width of the MRAM stack may allow for void free ILD deposition therebetween.

In certain embodiments, the method may further include forming a tapered portion of the first hardmask layer that extends from an upper surface of the first hardmask layer. The tapered portion may allow for more ILD deposition space between adjacent MRAM devices.

In certain embodiments, the tapered portion may have a taper angle ranging from 5 to 45 degrees relative to a vertical direction of the MRAM device. The tapered portion may allow for more ILD deposition space between adjacent MRAM devices.

In certain embodiments, forming the tapered portion of the first hardmask layer includes forming the first hardmask layer and the second hardmask layer to a same width, removing material of the second hardmask layer so that the second hardmask layer has a width less than that of the first hardmask layer, depositing a spin on glass (SOG) layer on the MRAM stack, the SOG layer having a height that is less than a height of the first hardmask layer, removing material of the first hardmask layer to form the tapered portion of the first hardmask layer, the tapered portion extending from an upper surface of the first hardmask layer to an upper surface of the SOG layer, and removing the SOG layer. The SOG layer may allow for forming the tapered portion of the first hardmask layer, which may allow for more ILD deposition space between adjacent MRAM devices.

In certain embodiments, the first hardmask layer/second hardmask layer includes a combination of materials selected from the group consisting of: TaN/WCN; TiN/WCN; TaAlN/WN; and TiAlN/WN. The different materials may allow for etching selectivity between the first and second hardmask layers, which allows the taper to be formed only on the first hardmask layer, which may allow for more ILD deposition space between adjacent MRAM devices.

In certain embodiments, forming the hardmask structure includes forming a first hardmask layer having a tapered portion of the first hardmask layer that extends from an upper surface of the first hardmask layer. This may allow for more ILD deposition space between adjacent MRAM devices.

In certain embodiments, forming the tapered portion of the first hardmask layer includes forming the first hardmask layer on the MRAM stack, depositing a spin on glass (SOG) layer on the MRAM stack around the first hardmask layer, the SOG layer having a height that is less than a height of the first hardmask layer, removing material of the first hardmask layer to form the tapered portion of the first hardmask layer, the tapered portion extending from an upper surface of the first hardmask layer to an upper surface of the SOG layer, and removing the SOG layer. This may allow for more ILD deposition space between adjacent MRAM devices.

Other embodiments relate to an MRAM device. The MRAM device includes a first electrode, an MRAM stack formed on the first electrode, a hardmask structure formed on the MRAM stack, and a second electrode formed on the hardmask structure. A width of an upper portion of the hardmask structure is less than a width of the MRAM stack. According to certain embodiments, a wider opening between adjacent MRAM devices owing to the lesser width of the upper portion of the hardmask structure may allow for void free ILD deposition therebetween.

In certain embodiments, the MRAM device further includes an interlayer dielectric (ILD) layer formed around the MRAM stack and the hardmask structure. As discussed above, the ILD layer may be deposited without voids.

In certain embodiments, the hardmask structure includes a first hardmask layer comprising a first material composition, and a second hardmask layer formed on the first hardmask layer and comprising a second material composition, the first material composition being different than the second material composition. In certain embodiments, the second hardmask layer has a width that is less than that of the first hardmask layer. According to certain embodiments, a wider opening between adjacent MRAM devices owing to the lesser width of the second hardmask layer relative to a width of the MRAM stack may allow for void free ILD deposition therebetween.

In certain embodiments, the first hardmask layer includes a tapered portion that extends from an upper surface of the first hardmask layer. The tapered portion may allow for more ILD deposition space between adjacent MRAM devices.

In certain embodiments, the tapered portion has a taper angle ranging from 5 to 45 degrees relative to a vertical direction of the MRAM device. The tapered portion may allow for more ILD deposition space between adjacent MRAM devices.

In certain embodiments, the first hardmask layer/second hardmask layer include a combination of materials selected from the group consisting of: TaN/WCN; TiN/WCN; TaAlN/WN; and TiAlN/WN. The different materials may allow for etching selectivity between the first and second hardmask layers, which allows the taper to be formed only on the first hardmask layer, which may allow for more ILD deposition space between adjacent MRAM devices.

In certain embodiments, the hardmask structure includes a first hardmask layer having a tapered portion of the first hardmask layer that extends from an upper surface of the first hardmask layer. This may allow for more ILD deposition space between adjacent MRAM devices.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

FIG. 3 is a cross-sectional view of the semiconductor device of FIG. 2 after additional fabrication operations, according to embodiments.

FIG. 4 is a cross-sectional view of the semiconductor device of FIG. 3 after additional fabrication operations, according to embodiments.

FIG. 5 is a cross-sectional view of the semiconductor device of FIG. 4 after additional fabrication operations, according to embodiments.

FIG. 6 is a cross-sectional view of the semiconductor device of FIG. 5 after additional fabrication operations, according to embodiments.

FIG. 7 is a cross-sectional view of the semiconductor device of FIG. 6 after additional fabrication operations, according to embodiments.

FIG. 8 is a cross-sectional view of the semiconductor device of FIG. 7 after additional fabrication operations, according to embodiments.

FIG. 9 is a cross-sectional view of the semiconductor device of FIG. 8 after additional fabrication operations, according to embodiments.

FIG. 10 is a cross-sectional view of the semiconductor device of FIG. 9 after additional fabrication operations, according to embodiments.

DETAILED DESCRIPTION

Figure 2:
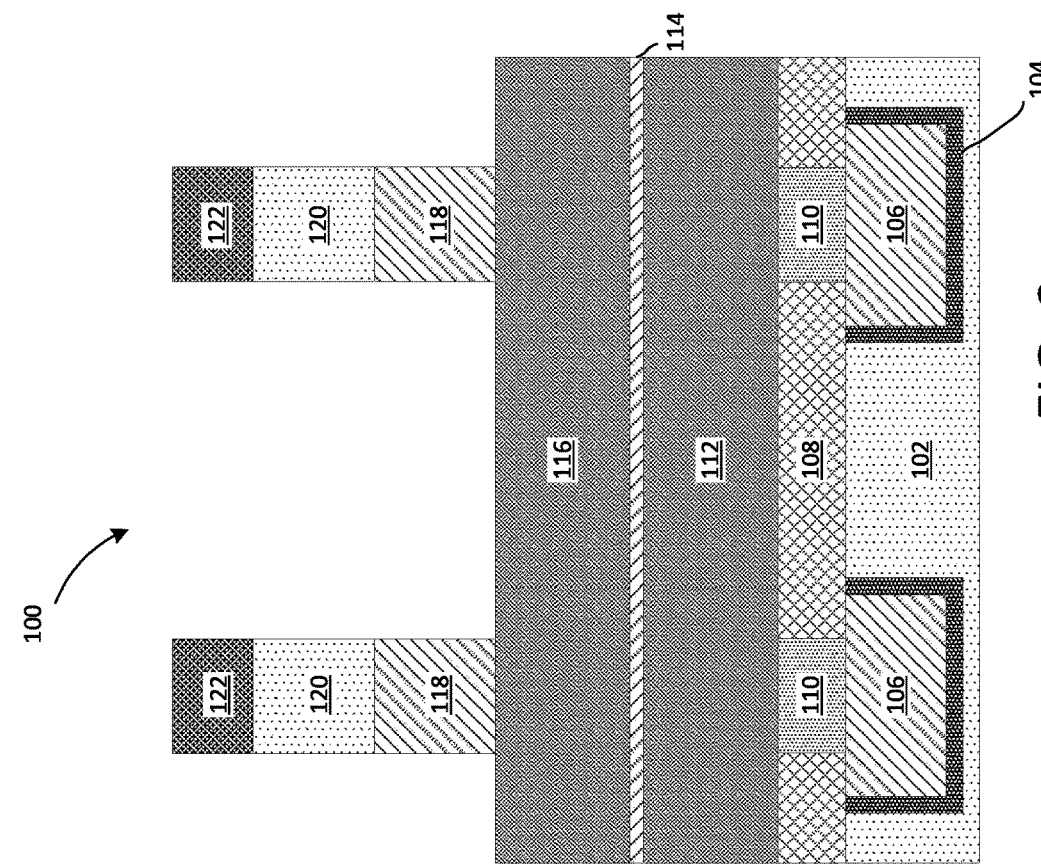
FIG. 2 is a cross-sectional view of the semiconductor device of FIG. 1 after additional fabrication operations, according to embodiments.

The present disclosure describes MRAM devices including magnetic tunnel junction ("MTJ") stacks and methods of manufacturing MRAM devices. In particular, the present disclosure describes MRAM devices which include different shapes/profiles for upper hardmask layers that may allow for a wider gap between adjacent MTJ stacks (pillars). The wider gaps may allow for deposition of an interlayer dielectric (ILD) between the pillars without forming voids therein.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded DRAM (eDRAM) is a dynamic random-access memory (DRAM) integrated on the same die or multi-chip module (MCM) of an application-specific integrated circuit (ASIC) or microprocessor. eDRAM has been implemented in silicon-on-insulator (SOI) technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years. Magnetoresistive random-access memory (MRAM) devices using magnetic tunnel junctions (MTJ) are one option to replace existing eDRAM technologies. MRAM is a non-volatile memory, and this benefit is a driving factor that is accelerating the development of this memory technology.

A magnetic tunnel junction (MTJ) device, which is a primary storage element in a magnetic random access memory (MRAM), is a magnetic storage and switching device in which two ferromagnetic layers are separated by a thin insulating oxide layer (i.e., a tunnel barrier layer) to form a stacked structure. The tunnel barrier layer may comprise, for example, magnesium oxide or aluminum oxide. One of the ferromagnetic layers has a magnetization that is fixed, and it is therefore referred to as a magnetic fixed layer (or pinned layer, or reference layer). However, the other ferromagnetic layer has a magnetization that can change, and it is therefore referred to as a free layer (or magnetic free layer). When a bias is applied to the MTJ device, electrons that are spin polarized by the ferromagnetic layers traverse the insulating barrier through a process known as quantum tunneling to generate an electric current whose magnitude depends on an orientation of magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented anti-parallel to the fixed layer magnetic moment.

For high performance MRAM devices based on perpendicular MTJ structures, well defined interfaces and interface control may be desired. MTJ structures may include a Co-based synthetic anti-ferromagnet (SAF), a CoFeB-based reference layer, a MgO-based tunnel barrier layer, a CoFeB-based free layer, and cap layers containing, for example, Ta and/or Ru. However, it should be appreciated that is other embodiments, other suitable materials or material combinations may be used. In certain embodiments, embedded MTJ structures may be formed by subtractive patterning of blanket MTJ stacks into pillars between two metal levels.

After the MTJ stack patterning, the inter-pillar spaces may be filled with an interlayer dielectric (ILD) layer/material to enable connection to back end of line (BEOL) wiring by a top contact level. The ILD gapfill between pillars may present a challenge because the presence of any voids in the ILD (i.e., incomplete filling or air gaps) between the pillars can lead to shorts when subsequent metal layers (e.g., top electrodes) are deposited. If there are gaps in the ILD layer, the metal material (e.g., from the top electrodes or top contacts) may intrude into the ILD gaps and inadvertently make a connection between adjacent MTJ pillars. However, as described in detail herein, the present embodiments may enable a reduction or elimination in ILD voids and electrical shorts by widening the openings between MTJ stack pillars prior to ILD deposition.

The present disclosure describes MRAM devices including magnetic tunnel junction ("MTJ") stacks and methods of manufacturing MRAM devices. In particular, the present disclosure describes MRAM devices which include different types of MRAM devices (e.g., embedded memory (e.g., a persistent memory device) and cache) on the same level (e.g., formed on the same level on a BEOL base layer). Each of the different types of MRAM devices may have different critical dimensions (CDs), different overall heights, different thicknesses to the component layers of the MRAM device, and/or different material compositions of one or more of the MRAM device layers.

A magnetic tunnel junction (MTJ) device, which is a primary storage element in a magnetic random access memory (MRAM), is a magnetic storage and switching device in which two ferromagnetic layers are separated by a thin insulating barrier (e.g., aluminum oxide) to form a stacked structure. One of the ferromagnetic layers has a magnetization that is fixed, and it is therefore referred to as a fixed layer or pinned layer or reference layer. However, the other ferromagnetic layer has a magnetization that can change, and it is therefore referred to as a free layer. When a bias is applied to the MTJ device, electrons that are spin polarized by the ferromagnetic layers traverse the insulating barrier through a process known as quantum tunneling to generate an electric current whose magnitude depends on an orientation of magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented anti-parallel to the fixed layer magnetic moment.

The materials and geometries used to build the stack of different layers forming the MTJ device are factors that affect the characteristics of the device in terms of speed (i.e., switching time) and power consumption (e.g., voltage and/or current required to switch the device from one state to another). As discussed briefly above, certain MTJ devices have a pillar structure (i.e., a stack of materials) having a cylindrical shape, where current flows from a top layer to a bottom layer, or vice versa, in order to switch the magnetization of one ferromagnetic layer. These types of MTJ devices are generally referred to as spin transfer torque (STT) MTJ devices. Certain STT MRAM devices may have limited switching speed and endurance in comparison to static random access memory (SRAM) devices (i.e., random access memory that retains data bits in its memory as long as power is being supplied). Other types of MTJ devices are referred to as spin orbit torque (SOT) devices. In the SOT type of device, the stacked pillar structure is still cylindrically shaped, but the stack is deposited on top of a heavy metal conductor. In the SOT type of MTJ device, current flows horizontally in this conductor and switches the magnetization of the ferromagnetic layer at the interface.

In STT type MRAM devices, the manufacture of the devices is often performed in conjunction with forming middle-of-line (MOL) or back-end-of-line (BEOL) layers. This may be referred to as embedded MRAM, where the MRAM devices are embedded in, or formed in conjunction with these layers. In general, front-end-of-line (FEOL) refers to the set of process steps that form transistors and other circuit elements (such as resistors and capacitors) that are later connected electrically with middle-of-line (MOL) and back-end-of-line (BEOL) layers. In general, MOL refers to the set of wafer processing steps used to create the structures that provide the local electrical connections between transistors (e.g., gate contact formation). MOL processing generally occurs after FEOL processes and before BEOL processes. In general, the BEOL is the portion of IC fabrication where the individual devices (transistors, capacitors, resistors, etc.) are interconnected with wiring on the wafer.

As discussed above, MRAM devices may be useful for a variety of different applications, such as embedded storage and cache. The embodiments described herein provide MRAM devices and method of manufacturing MRAM devices, where a plurality of different types/configurations may be present on a same level of a chip.

Figure 1:
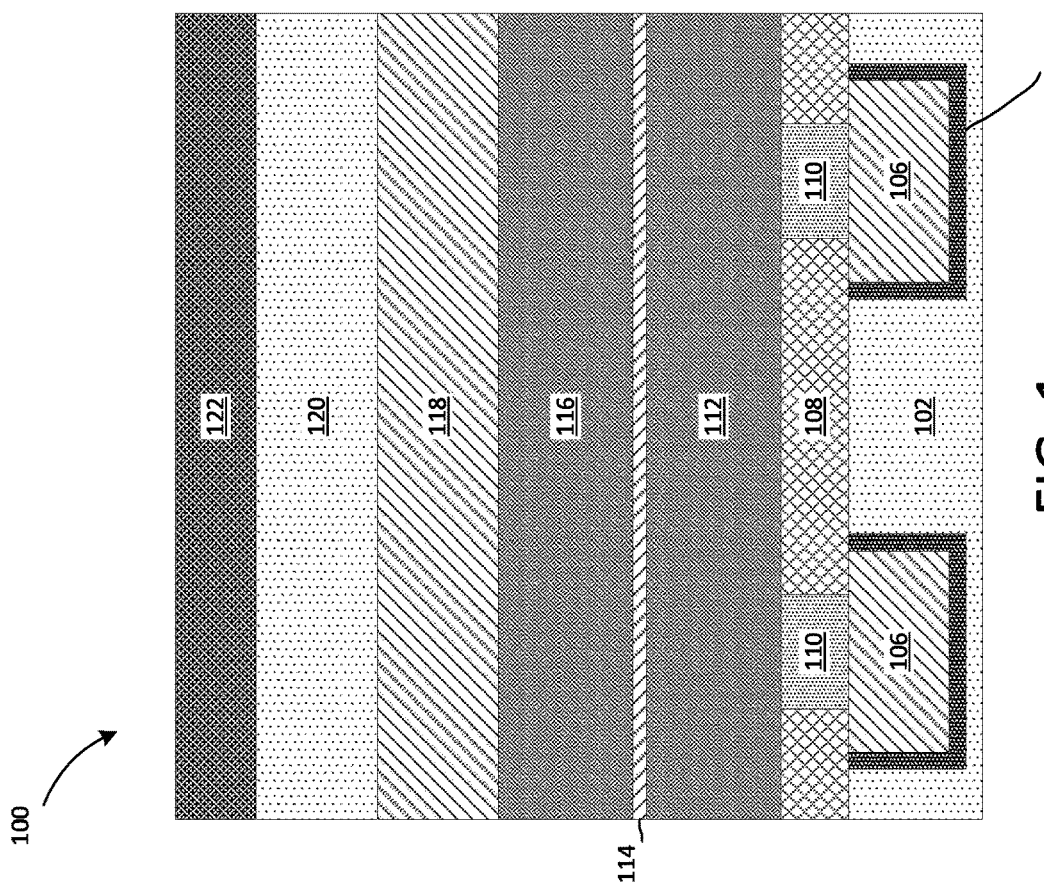
FIG. 1 is a cross-sectional view of a semiconductor device that includes an MRAM device at an intermediate stage of the manufacturing process, according to embodiments.

Referring now to the drawings in which like numerals represent the same or similar elements and initially to FIG. 1, an exemplary method of manufacturing a MRAM device to which the present embodiments may be applied is shown. In certain examples, several back end of line ("BEOL") layers (not shown) and front end of line (FEOL) layers (not shown) may be formed.

In general, the front-end-of-line (FEOL) is the first portion of IC fabrication where the individual devices (transistors, capacitors, resistors, etc.) are patterned in the semiconductor. FEOL generally covers everything up to (but not including) the deposition of metal interconnect layers.

In general, the BEOL is the second portion of IC fabrication where the individual devices (transistors, capacitors, resistors, etc.) are interconnected with wiring on the wafer. The BEOL metal layers (not shown) can include, for example, Cu, TaN, Ta, Ti, TiN or a combination thereof. A BEOL dielectric layer (not shown) may be formed on the sides of one or more of the BEOL metal layers. The BEOL dielectric layer may be composed of, for example, $SiO_x$, $SiN_x$, SiBCN, low-κ, NBLOK, or any other suitable dielectric material. The structure including the FEOL/BEOL layers (not shown) may be a starting structure upon which the MRAM devices are formed.

As shown in the semiconductor device 100 of FIG. 1, a first interlayer dielectric (ILD) layer 102 is provided as a base layer into which a bottom metal layer (or bottom electrode) of the MRAM device 100 may be formed. In certain embodiments, a combined via interconnect structure (e.g., a metal liner layer 104 and a metal layer 106) represents a bottom contact for coupling to a bottom electrode layer 108. The bottom electrode layer 108 may be comprised of any suitable insulating material (e.g., the same material or different material comprising the first ILD layer 102. Bottom electrodes 110 are formed in the bottom electrode layer 108.

As shown in FIG. 1, an M-RAM stack is formed on the upper surfaces of the bottom electrode layer 108. The MRAM stack may include multiple layers such as, for example, multiple magnetic layers separated by an insulating layer. In certain embodiments, the MRAM stack includes a reference layer 112, a tunnel barrier layer 114, a magnetic free layer 116. The reference layer 112 (or fixed layer) may, for example, be annealed in a magnetic field to set a polarization state of the reference layer 112 in the MTJ. The tunnel barrier layer 114 is formed on the reference layer 112. Following the formation of the tunnel barrier layer 114, the magnetic free layer 116 is formed on the tunnel barrier layer 114. Next, a hardmask is formed on the magnetic free layer 116. In certain embodiments, the hardmask is a bilayer hardmask structure including a first hardmask layer 118 formed on the magnetic free layer 116, and a second hardmask layer 120 formed on the first hardmask layer 118. At least initially, the first hardmask layer 118 and the second hardmask layer 120 are formed over the entire MRAM device 100 as a continuous layer. In certain examples, the material of the first hardmask layer 118 may be TaN or any other suitable material(s). In certain examples, the material of the second hardmask layer 120 may comprise a tungsten carbon nitride (WCN) material. However, it should be appreciated that the materials of the first and second hardmask layers may contain other suitable materials. For example, the first hardmask layer 118/second hardmask layer 120 may include the following combinations of materials: TaN/WCN; TiN/WCN; TaAlN/WN; and TiAlN/WN, etc. However, it should be appreciated that the first hardmask layer 118 should have a different material composition than the second hardmask layer 120 so that there is a wet etching selectivity between the layers. As outlined herein, in certain embodiments having a bilayer hardmask, it may be desired to etch one layer without significantly etching the other.

As also shown in FIG. 1, an $SiO_2$ layer 122 is provided on the second hardmask layer 120. It should be appreciated that the material of the $SiO_2$ layer 122 may be any other suitable dielectric hardmask material or $SiO_2$-based material, and may be deposited using tetra-ethyl-ortho-silane (TEOS). It should be appreciated that this MRAM stack structure is only an example, and any other suitable MRAM stack structure known to one of skill in the art may be utilized. It should also be appreciated that this example MRAM stack structure may include one or more additional layers, include intervening layers, and any of the layers described with respect to the MRAM stack structure may contain a plurality of sublayers.

Referring now to FIG. 2, this figure is a cross-sectional view of the semiconductor device 100 including the MRAM of FIG. 1 after additional fabrication operations, according to embodiments. As shown in FIG. 2, the first hardmask layer 118, second hardmask layer 120 and the $SiO_2$ layer 122 are patterned.

Referring now to FIG. 3, this figure is a cross-sectional view of the semiconductor device 100 including the MRAM of FIG. 2 after additional fabrication operations, according to embodiments. As shown in FIG. 3, the second hardmask layer 120 is partially removed with a suitable wet etching technique. An appropriate etchant may be selected so that the material of the second hardmask layer 120 is removed without significantly impacting/removing the material of the first hardmask layer 118 (and the $SiO_2$ layer 122). Thus, the second hardmask layer 120 is now recessed laterally with respect to the first hardmask layer 118.

Referring now to FIG. 4, this figure is a cross-sectional view of the semiconductor device 100 including the MRAM of FIG. 3 after additional fabrication operations, according to embodiments. As shown in FIG. 4, after the removal of the portions of the second hardmask layer 120, the $SiO_2$ layer 122 is completely removed. At this point in the manufacturing process, a dual hardmask structure remains where the upper hardmask layer (i.e., the second hardmask layer 120) is narrower than the lower hardmask layer (i.e., the first hardmask layer 120).

Referring now to FIG. 5, this figure is a cross-sectional view of the semiconductor device 100 including the MRAM of FIG. 4 after additional fabrication operations, according to embodiments. As shown in FIG. 5, after the removal of the $SiO_2$ layer 122, a spin-on-glass (SOG) based material is deposited to a thickness that is less than the thickness of the first hardmask layer 118 to form a SOG layer 123. This will allow for subsequent processing of the upper portion of the first hardmask layer 118 without affecting the shape of the lower portion of the hardmask layer. It should be appreciated that any suitable SOG material or combination of materials may be used.

Referring now to FIG. 6, this figure is a cross-sectional view of the semiconductor device 100 including the MRAM of FIG. 5 after additional fabrication operations, according to embodiments. As shown in FIG. 6, a top corner rounding operation is performed on the first hardmask layer 118 to optimize the shape of this layer to have a tapered shape transitioning from a bottom surface of the second hardmask layer 120 (i.e., the top surface of the first hardmask layer 118) to the top surface of the SOG layer 123. This process may be performed with, for example, an ion bombardment technique such as RIE. In certain examples, the tapered portion has a taper angle ranging from 5 to 45 degrees relative to a vertical direction of the MRAM device Referring now to FIG. 7, this figure is a cross-sectional view of the semiconductor device 100 including the MRAM of FIG. 6 after additional fabrication operations, according to embodiments. As shown in FIG. 7, after the corner etching of the top portion of the first hardmask layer 118, the SOG layer 123 is completely removed with any suitable wet or dry etching technique(s). Thus, the SOG layer 123 is a sacrificial layer that is used temporarily in order to allow for the creation of the tapered profile of the first hardmask layer 118, and then it is removed.

Referring now to FIG. 8, this figure is a cross-sectional view of the semiconductor device 100 including the MRAM of FIG. 7 after additional fabrication operations, according to embodiments. As shown in FIG. 8, after the removal of the SOG layer 123 described above with respect to FIG. 7, the magnetic tunnel junction (MTJ) stack (i.e., the reference layer 112, the tunnel barrier layer 114, and the magnetic free layer 116) is etched to create the MTJ pillars.

Referring now to FIG. 9, this figure is a cross-sectional view of the semiconductor device 100 including the MRAM of FIG. 8 after additional fabrication operations, according to embodiments. As shown in FIG. 9, after the MTJ stack patterning operations are performed, a dielectric encapsulation layer 124 is deposited over the entire surface of the semiconductor device 100. The dielectric encapsulation layer 124 may comprise, for example, SiN. One purpose of the dielectric encapsulation layer 124 is to isolate the tunnel barrier layer 114 from the outside environment. In certain examples, the formation of the dielectric encapsulation layer 124 is followed by the formation of an interlayer dielectric layer (ILD) which may be an oxide based dielectric material that may be formed by an aggressive deposition process. Thus, the dielectric encapsulation layer 124 may help protect the tunnel barrier layer 114 from damage during such a process.

Referring now to FIG. 10, this figure is a cross-sectional view of the semiconductor device 100 including the MRAM of FIG. 9 after additional fabrication operations, according to embodiments. As shown in FIG. 10, after the conformal deposition of the dielectric encapsulation layer 124, horizontal portions thereof are removed. The removal of these portions of the dielectric encapsulation layer 124 expose the upper surfaces of the second hardmask layer 120 and the insulating material of the bottom electrode layer 108.

Figure 11:
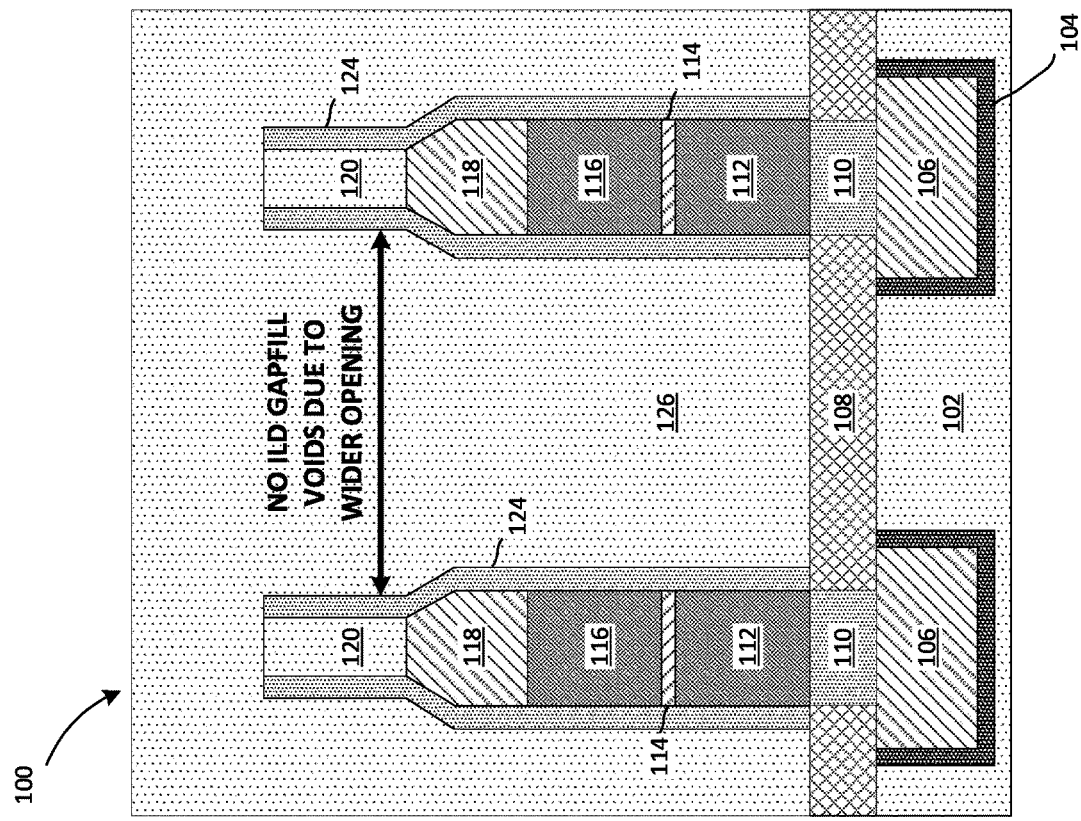
FIG. 11 is a cross-sectional view of the semiconductor device of FIG. 10 after additional fabrication operations, according to embodiments.

Referring now to FIG. 11, this figure is a cross-sectional view of the semiconductor device including the MRAM of FIG. 10 after additional fabrication operations, according to embodiments. As shown in FIG. 11, after the removal of the portions of the dielectric encapsulation layer 124, a second ILD layer 126 is deposited between the MTJ pillars. The second ILD layer 126 may be a low-κ material or any other suitable ILD material known to a person of skill in the art. As noted in FIG. 11, due to the previous narrowing of the second hardmask layer 120 and/or the tapering of the upper portions of the first hardmask layer 118, there is a wider opening between adjacent MRAM devices. This wider opening may facilitate the deposition of the second ILD layer 126 without forming voids between the devices. Thus, there may be the effect that there are less voids and consequently less electrical shorting between devices.

Figure 12:
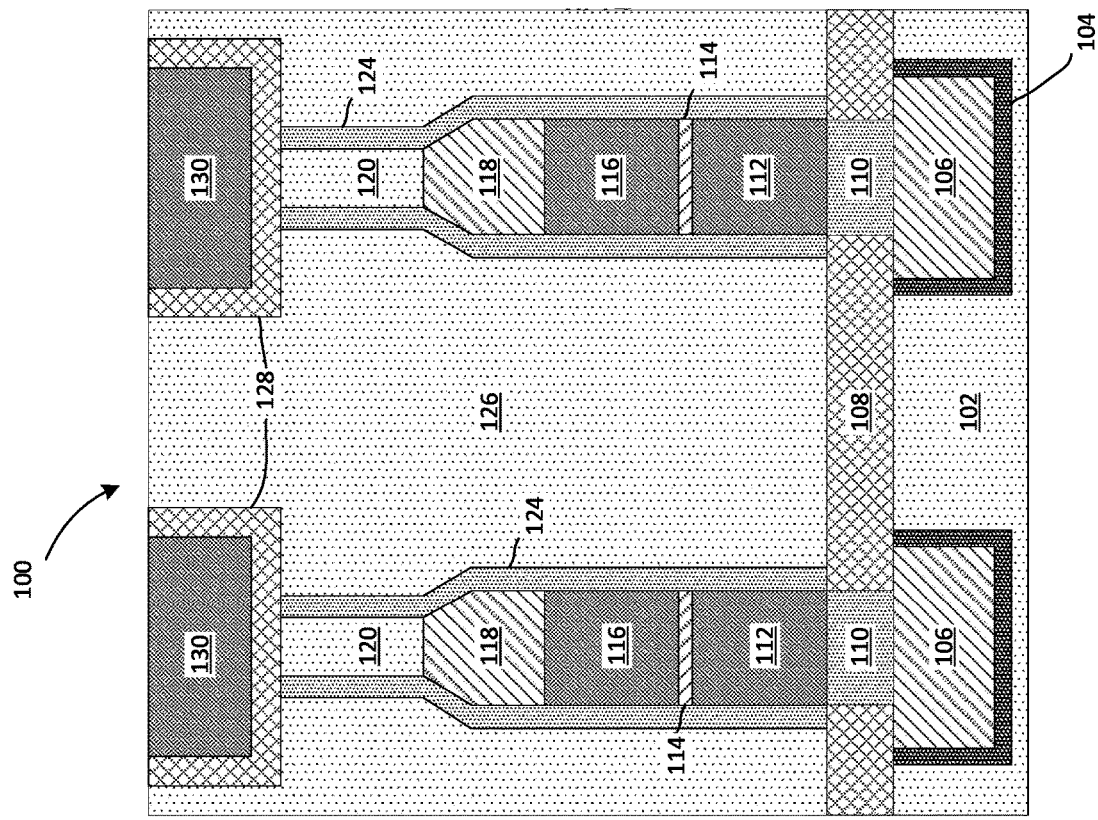
FIG. 12 is a cross-sectional view of the semiconductor device of FIG. 11 after additional fabrication operations, according to embodiments.

Referring now to FIG. 12, this figure is a cross-sectional view of the semiconductor device 100 including the MRAM of FIG. 11 after additional fabrication operations, according to embodiments. In certain embodiments, a combined via interconnect structure (e.g., a top metal liner layer 128 and a top metal layer 130) represents a top contact for coupling to the second hardmask layer 120. The top contact may be comprised of any suitable conducting materials and may be the same as or different from the bottom contact (i.e., the metal liner layer 104 and the metal layer 106).

Figures 13, 14:
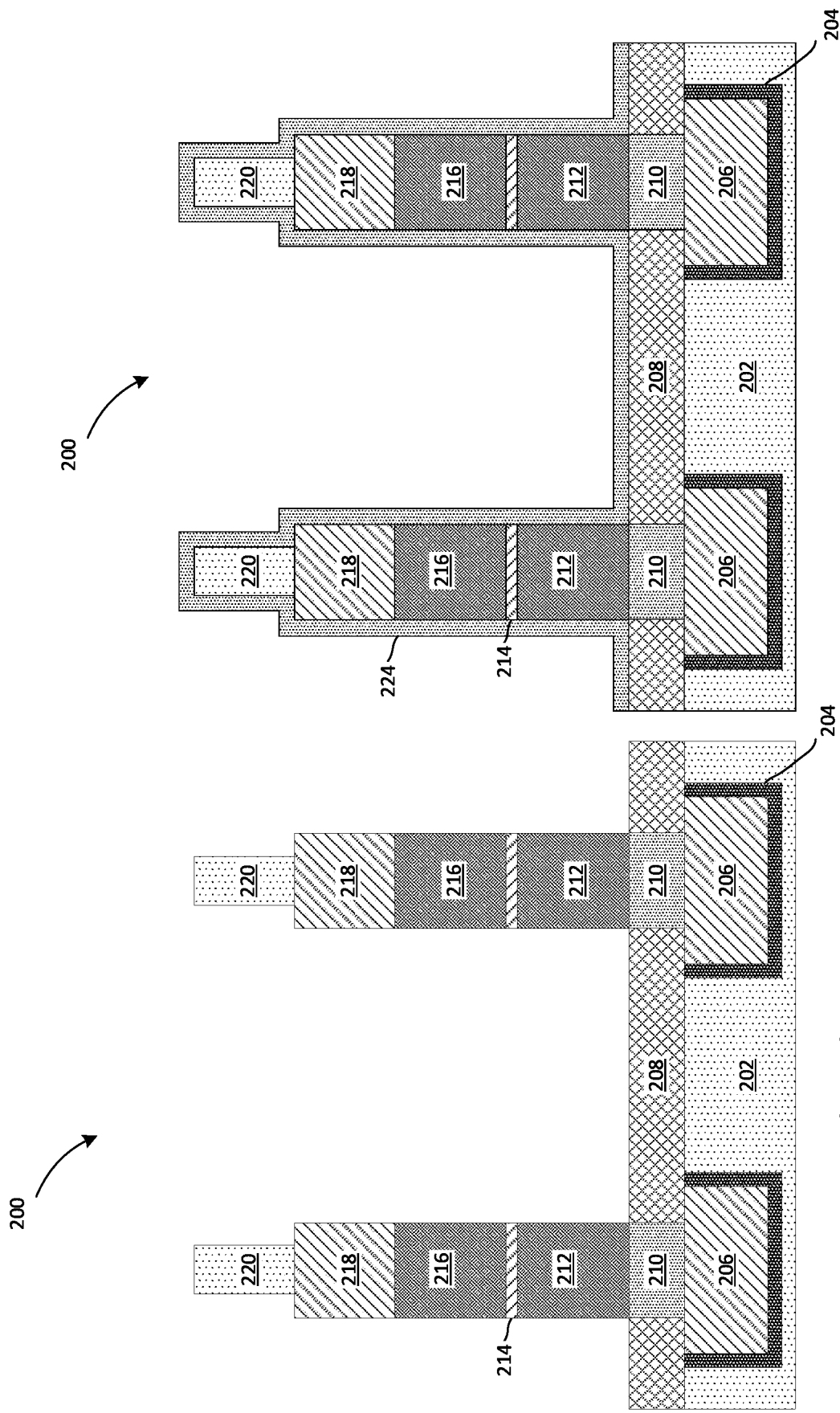
FIG. 13 is a cross-sectional view of a semiconductor device that includes an MRAM device at an intermediate stage of the manufacturing process, according to embodiments.
FIG. 14 is a cross-sectional view of the semiconductor device of FIG. 13 after additional fabrication operations, according to embodiments.

Referring now to FIG. 13, this figure is a cross-sectional view of a semiconductor device 200 including an MRAM device, according to embodiments. The semiconductor device 200 shown in FIG. 13 may be formed by the same processes and materials as the semiconductor device 100 described above with respect to FIGS. 1-4. In particular, a first interlayer dielectric (ILD) layer 202 is provided as a base layer into which a bottom metal layer (or bottom electrode) of the MRAM device 200 may be formed. In certain embodiments, a combined via interconnect structure (e.g., a metal liner layer 204 and a metal layer 206) represents a bottom contact for coupling to a bottom electrode layer 208. The bottom electrode layer 108 may be comprised of any suitable insulating material (e.g., the same material or different material comprising the first ILD layer 202. Bottom electrodes 210 are formed in the bottom electrode layer 208.

As shown in FIG. 13, an MRAM stack is formed on the upper surfaces of the bottom electrode layer 208. The MRAM stack may include multiple layers such as, for example, multiple magnetic layers separated by an insulating layer. In certain embodiments, the MRAM stack includes a reference layer 212, a tunnel barrier layer 214, a magnetic free layer 216. Next, a hardmask is formed on the magnetic free layer 216. In certain embodiments, the hardmask is a bilayer hardmask structure including a first hardmask layer 218 formed on the magnetic free layer 216, and a second hardmask layer 220 formed on the first hardmask layer 218. At least initially, the first hardmask layer 218 and the second hardmask layer 220 are formed over the entire MRAM device 200 as a continuous layer. In certain examples, the material of the first hardmask layer 218 may be TaN or any other suitable material(s). In certain examples, the material of the second hardmask layer 220 may comprise a tungsten carbon nitride (WCN) material. However, it should be appreciated that the materials of the first and second hardmask layers may contain other suitable materials. For example, the first hardmask layer 218/second hardmask layer 220 may include the following combinations of materials: TaN/WCN; TiN/WCN; TaAlN/WN; and TiAlN/WN, etc. However, it should be appreciated that the first hardmask layer 218 should have a different material composition than the second hardmask layer 220 so that there is a wet etching selectivity between the layers. As outlined herein, in certain embodiments having a bilayer hardmask, it may be desired to etch one layer without significantly etching the other.

As shown in FIG. 13, the second hardmask layer 220 is partially removed with a suitable wet etching technique (similar to the process shown and described above with respect to FIGS. 1-4). An appropriate etchant may be selected so that the material of the second hardmask layer 220 is removed without significantly impacting/removing the material of the first hardmask layer 218. Thus, the second hardmask layer 220 is recessed laterally with respect to the first hardmask layer 218. As shown in FIG. 13, the magnetic tunnel junction (MTJ) stack (i.e., the reference layer 212, the tunnel barrier layer 214, and the magnetic free layer 216) is etched to create the MTJ pillars.

Referring now to FIG. 14, this figure is a cross-sectional view of the semiconductor device 200 including the MRAM of FIG. 13 after additional fabrication operations, according to embodiments. As shown in FIG. 13, after the MJT stack patterning operations are performed, a dielectric encapsulation layer 224 is deposited over the entire surface of the semiconductor device 200. The dielectric encapsulation layer 224 may comprise, for example, SiN. One purpose of the dielectric encapsulation layer 224 is to isolate the tunnel barrier layer 214 from the outside environment. In certain examples, the formation of the dielectric encapsulation layer 224 is followed by the formation of an interlayer dielectric layer (ILD) which may be an oxide based dielectric material that may be formed by an aggressive deposition process. Thus, the dielectric encapsulation layer 224 may help protect the tunnel barrier layer 214 from damage during such a process.

Figure 15:
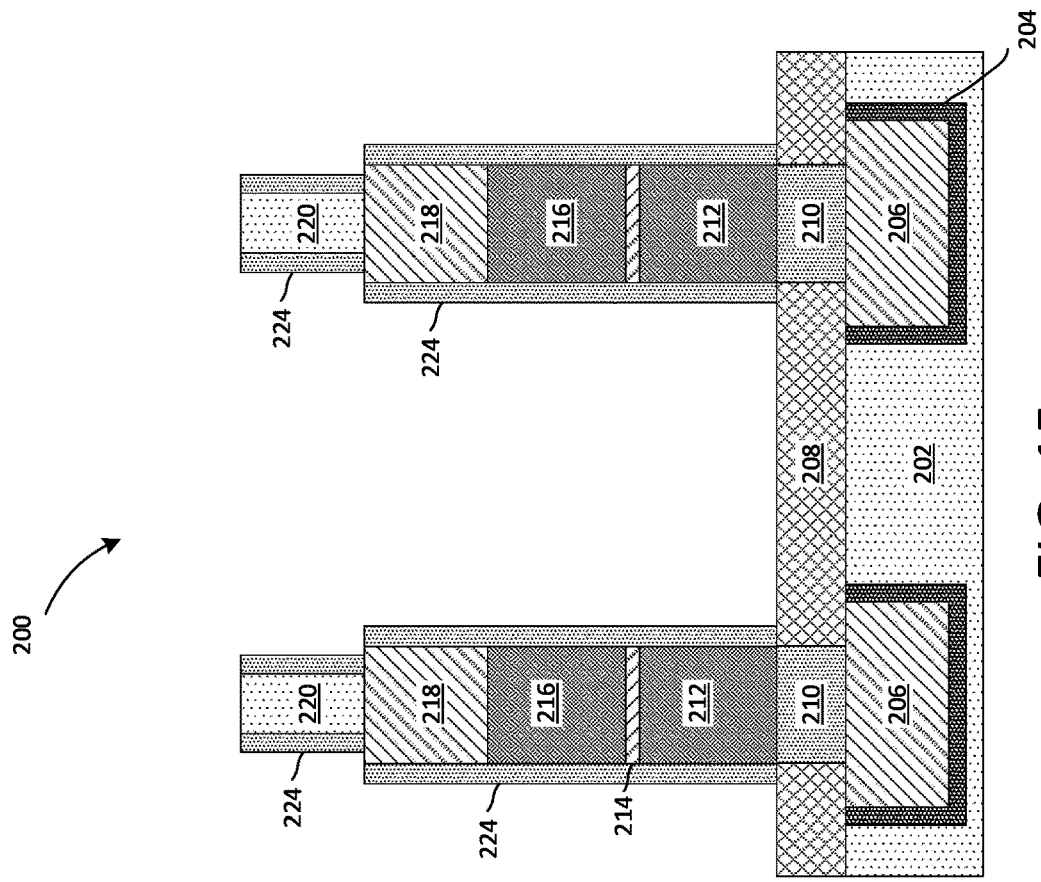
FIG. 15 is a cross-sectional view of the semiconductor device of FIG. 14 after additional fabrication operations, according to embodiments.

Referring now to FIG. 15, this figure is a cross-sectional view of the semiconductor device 200 including the MRAM of FIG. 14 after additional fabrication operations, according to embodiments. As shown in FIG. 15, after the conformal deposition of the dielectric encapsulation layer 224, horizontal portions thereof are removed. The removal of these portions of the dielectric encapsulation layer 224 expose the upper surfaces of the second hardmask layer 220 and the insulating material of the bottom electrode layer 108.

Figure 16:
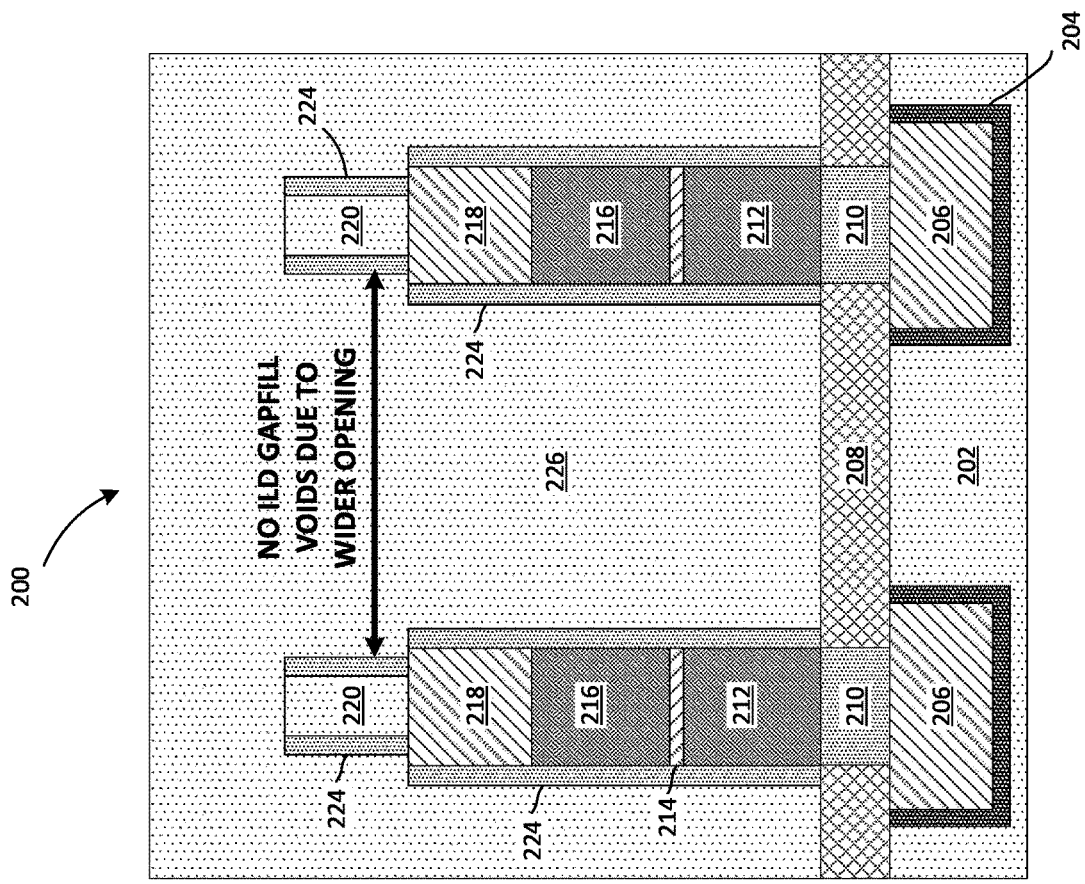
FIG. 16 is a cross-sectional view of the semiconductor device of FIG. 15 after additional fabrication operations, according to embodiments.

Referring now to FIG. 16, this figure is a cross-sectional view of the semiconductor device including the MRAM of FIG. 15 after additional fabrication operations, according to embodiments. As shown in FIG. 16, after the removal of the portions of the dielectric encapsulation layer 224, a second ILD layer 226 is deposited between the MTJ pillars. The second ILD layer 226 may be a low-κ material or any other suitable ILD material known to a person of skill in the art. As noted in FIG. 16, due to the previous narrowing of the second hardmask layer 220, there is a wider opening between adjacent MRAM devices. This wider opening may facilitate the deposition of the second ILD layer 226 without forming voids between the devices. Thus, there may be the effect that there are less voids and consequently less electrical shorting between devices. There is a difference between FIG. 16 and the embodiment discussed above with respect to FIG. 11 in that the first hardmask layer 218 has vertical side surfaces rather than the tapered profile of the first hardmask layer 118 of FIG. 11. However, there is still a wider opening between the adjacent MRAM stacks to allow for ease of ILD material fills while minimizing void formation.

Figure 17:
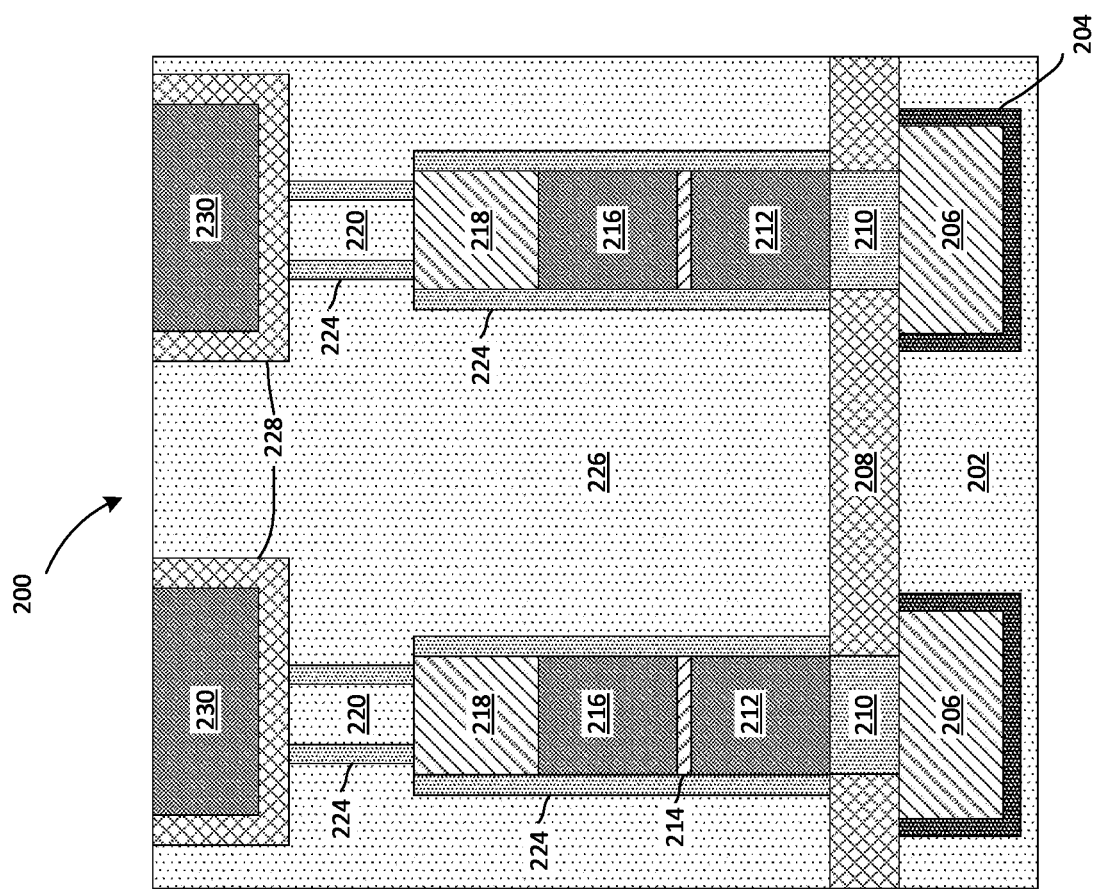
FIG. 17 is a cross-sectional view of the semiconductor device of FIG. 16 after additional fabrication operations, according to embodiments.

Referring now to FIG. 17, this figure is a cross-sectional view of the semiconductor device 100 including the MRAM of FIG. 16 after additional fabrication operations, according to embodiments. In certain embodiments, a combined via interconnect structure (e.g., a top metal liner layer 228 and a top metal layer 230) represents a top contact for coupling to the second hardmask layer 220. The top contact may be comprised of any suitable conducting materials and may be the same as or different from the bottom contact (i.e., the metal liner layer 204 and the metal layer 206).

Figure 18:
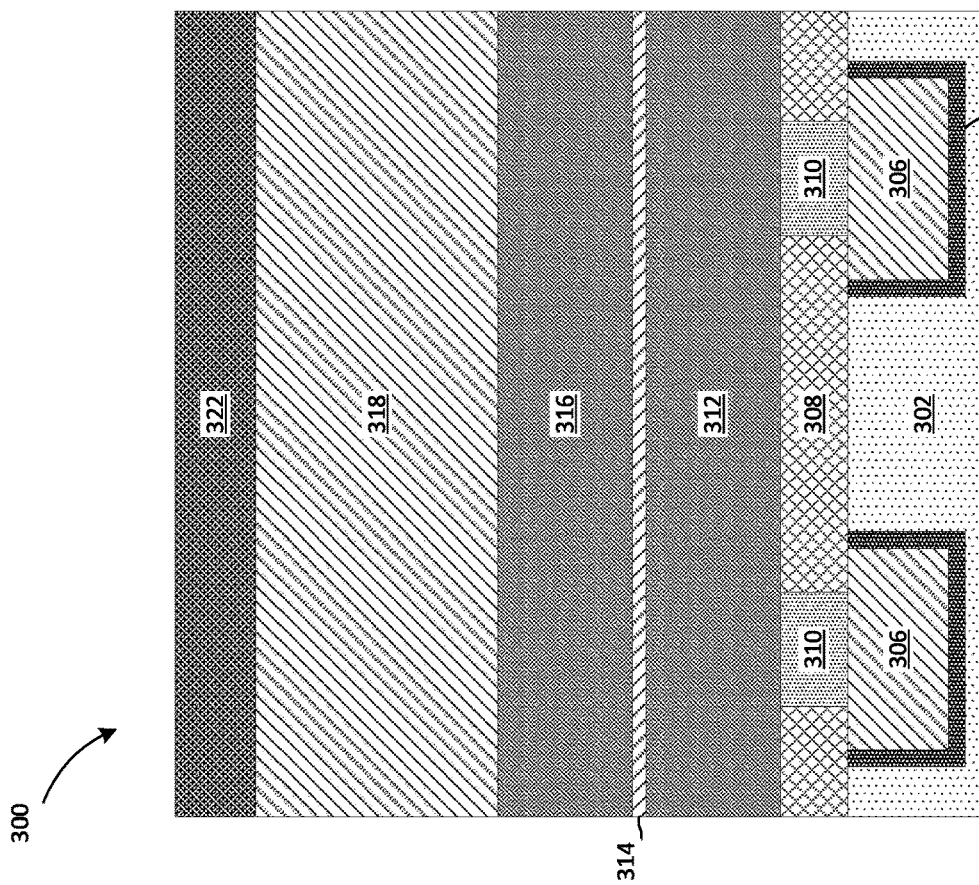
FIG. 18 is a cross-sectional view of a semiconductor device that includes an MRAM device at an intermediate stage of the manufacturing process, according to embodiments.

Referring now to FIG. 18, an exemplary method of manufacturing a MRAM device to which the present embodiments may be applied is shown. As shown in the semiconductor device 300 of FIG. 18, a first interlayer dielectric (ILD) layer 302 is provided as a base layer into which a bottom metal layer (or bottom electrode) of the MRAM device 300 may be formed. In certain embodiments, a combined via interconnect structure (e.g., a metal liner layer 304 and a metal layer 306) represents a bottom contact for coupling to a bottom electrode layer 308. The bottom electrode layer 308 may be comprised of any suitable insulating material (e.g., the same material or different material comprising the first ILD layer 302. Bottom electrodes 310 are formed in the bottom electrode layer 308.

As shown in FIG. 18, an MRAM stack is formed on the upper surfaces of the bottom electrode layer 308. The MRAM stack may include multiple layers such as, for example, multiple magnetic layers separated by an insulating layer. In certain embodiments, the MRAM stack includes a reference layer 312, a tunnel barrier layer 314, and a magnetic free layer 316. The reference layer 312 (or fixed layer) may, for example, be annealed in a magnetic field to set a polarization state of the reference layer 312 in the MTJ. The tunnel barrier layer 314 is formed on the reference layer 312. Following the formation of the tunnel barrier layer 314, the magnetic free layer 316 is formed on the tunnel barrier layer 314. Next, a hardmask is formed on the magnetic free layer 316. In certain embodiments, the hardmask is a single layer hardmask structure including a first hardmask layer 318 formed on the magnetic free layer 316. Thus, the hardmask structure is different from the embodiments described with respect to FIGS. 1-17 because there is only a single layer hardmask instead of the bilayer configuration. At least initially, the first hardmask layer 316 is formed over the entire MRAM device 300 as a continuous layer. In certain examples, the material of the first hardmask layer 318 may be TaN or any other suitable material(s). However, it should be appreciated that the materials of the first hardmask layer 318 may contain other suitable materials. For example, the first hardmask layer 318 may include the one or more of the following materials: TaN; TiN; and TaAlN, etc.

As also shown in FIG. 18, an $SiO_2$ layer 322 is provided on the first hardmask layer 318. It should be appreciated that the material of the $SiO_2$ layer 322 may be any other suitable dielectric hardmask material or $SiO_2$-based material, and may be deposited using tetra-ethyl-ortho-silane (TEOS). It should be appreciated that this MRAM stack structure is only an example, and any other suitable MRAM stack structure known to one of skill in the art may be utilized. It should also be appreciated that this example MRAM stack structure may include one or more additional layers, include intervening layers, and any of the layers described with respect to the MRAM stack structure may contain a plurality of sublayers.

Figure 19:
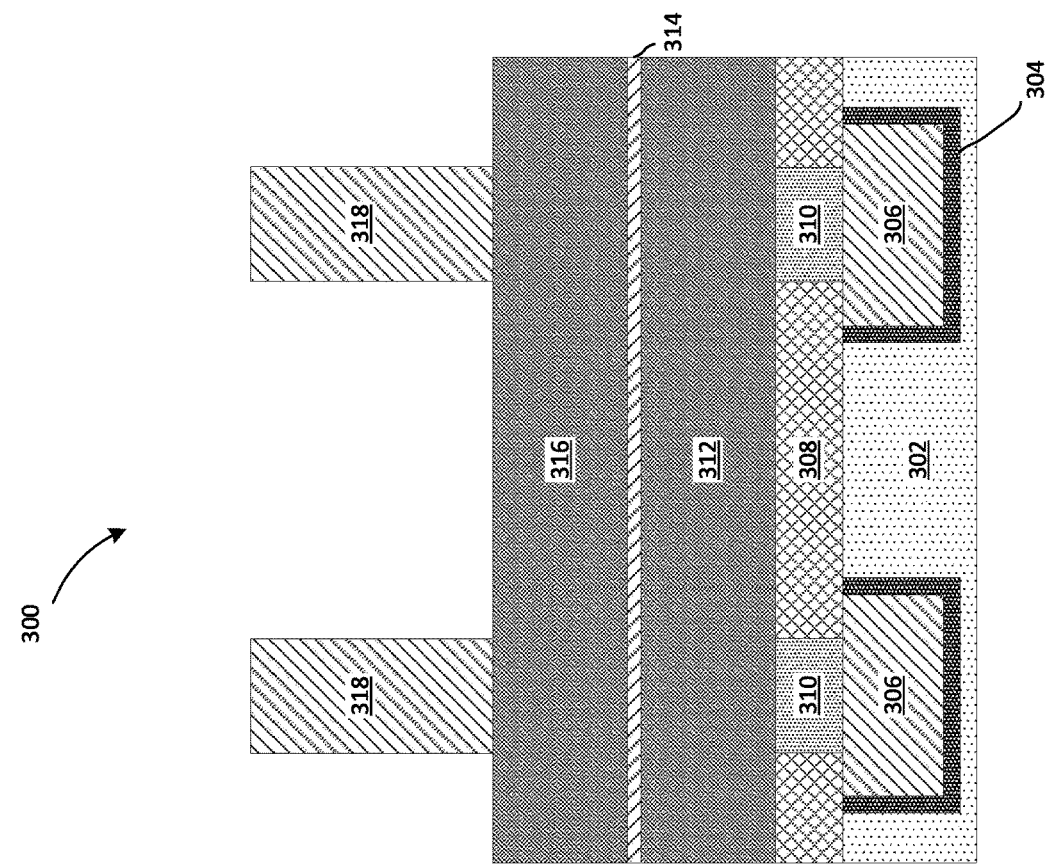
FIG. 19 is a cross-sectional view of the semiconductor device of FIG. 18 after additional fabrication operations, according to embodiments.

Referring now to FIG. 19, this figure is a cross-sectional view of the semiconductor device 300 including the MRAM of FIG. 18 after additional fabrication operations, according to embodiments. As shown in FIG. 19, the first hardmask layer 318 and the $SiO_2$ layer 322 are patterned. Then, the $SiO_2$ layer 322 is removed. At this point in the manufacturing process, a single hardmask structure remains.

Figure 20:
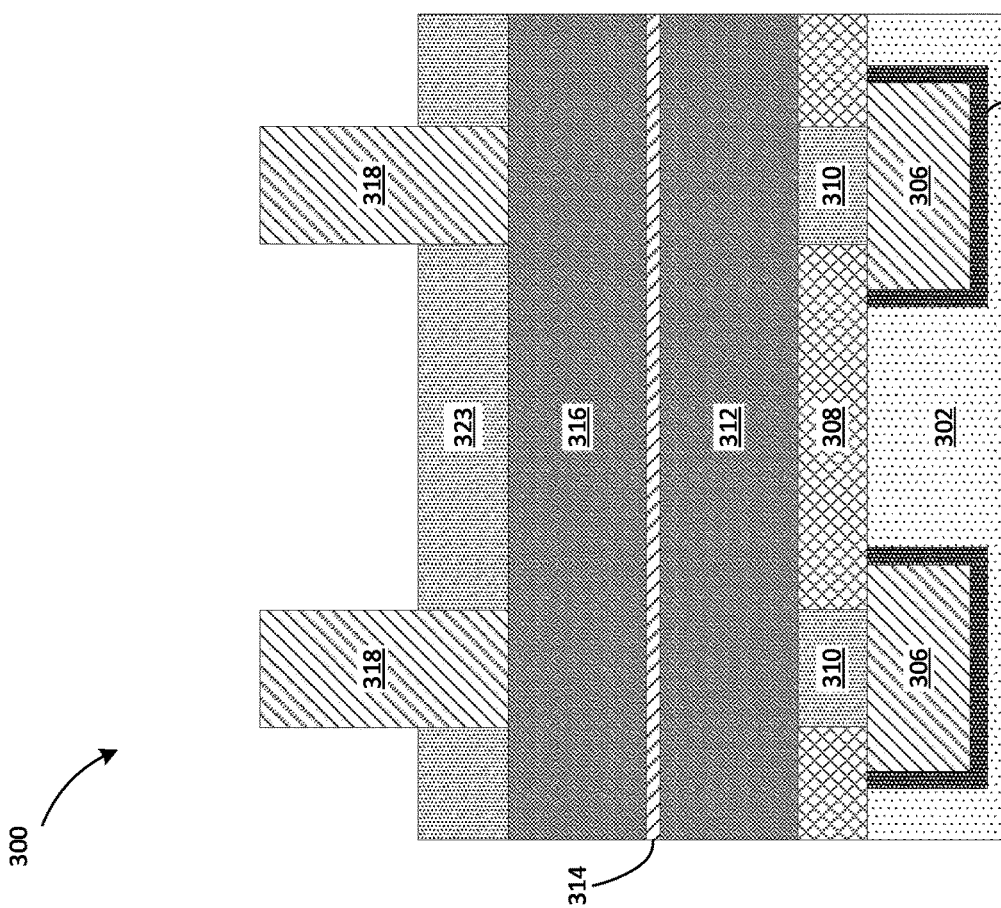
FIG. 20 is a cross-sectional view of the semiconductor device of FIG. 19 after additional fabrication operations, according to embodiments.

Referring now to FIG. 20, this figure is a cross-sectional view of the semiconductor device 300 including the MRAM of FIG. 19 after additional fabrication operations, according to embodiments. As shown in FIG. 20, after the removal of the $SiO_2$ layer 322, a spin-on-glass (SOG) based material is deposited to a thickness that is less than the thickness of the first hardmask layer 318 to form a SOG layer 323. This will allow for subsequent processing of the upper portion of the first hardmask layer 318 without affecting the shape of the lower portion of the hardmask layer. It should be appreciated that any suitable SOG material or combination of materials may be used.

Figure 21:
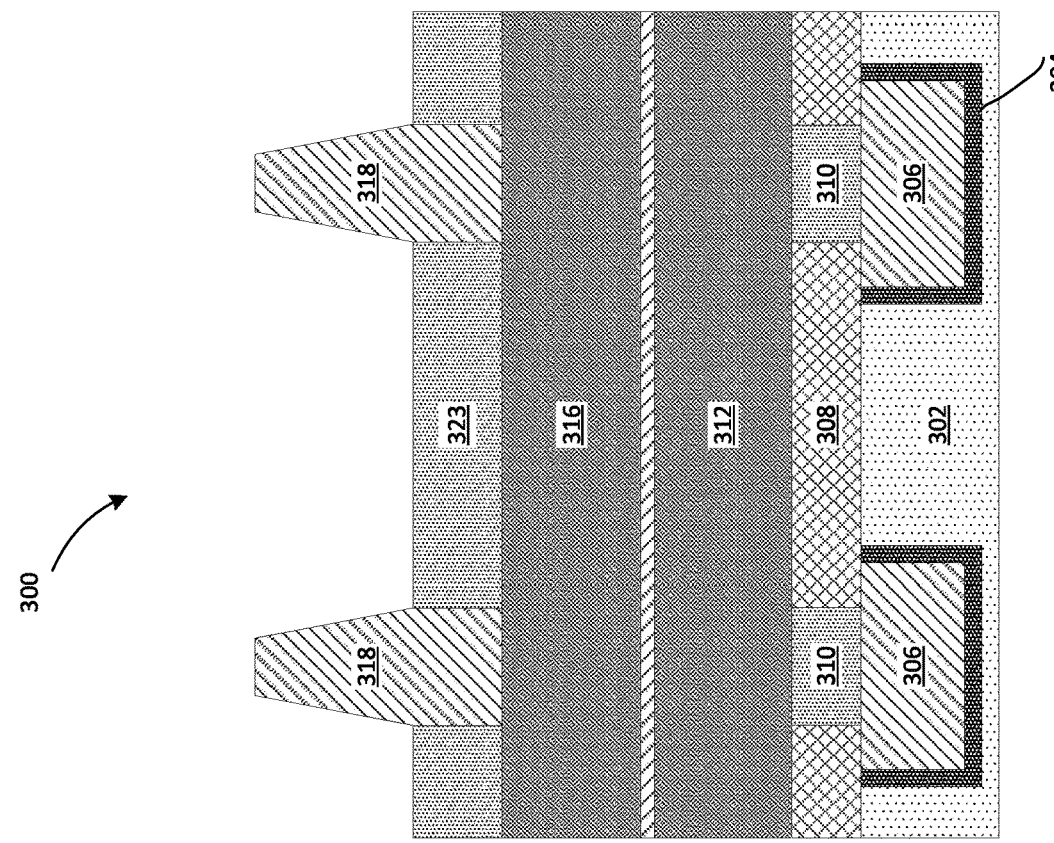
FIG. 21 is a cross-sectional view of the semiconductor device of FIG. 20 after additional fabrication operations, according to embodiments.

Referring now to FIG. 21, this figure is a cross-sectional view of the semiconductor device 300 including the MRAM of FIG. 20 after additional fabrication operations, according to embodiments. As shown in FIG. 21, a top corner rounding operation (or chamfering) is performed on the first hardmask layer 318 to optimize the shape of this layer to have a tapered shape transitioning from the top surface of the first hardmask layer 318 to the top surface of the SOG layer 323. This process may be performed with, for example, an ion bombardment technique such as RIE. In certain examples, the tapered portion has a taper angle ranging from 5 to 45 degrees relative to a vertical direction of the MRAM device.

Figure 22:
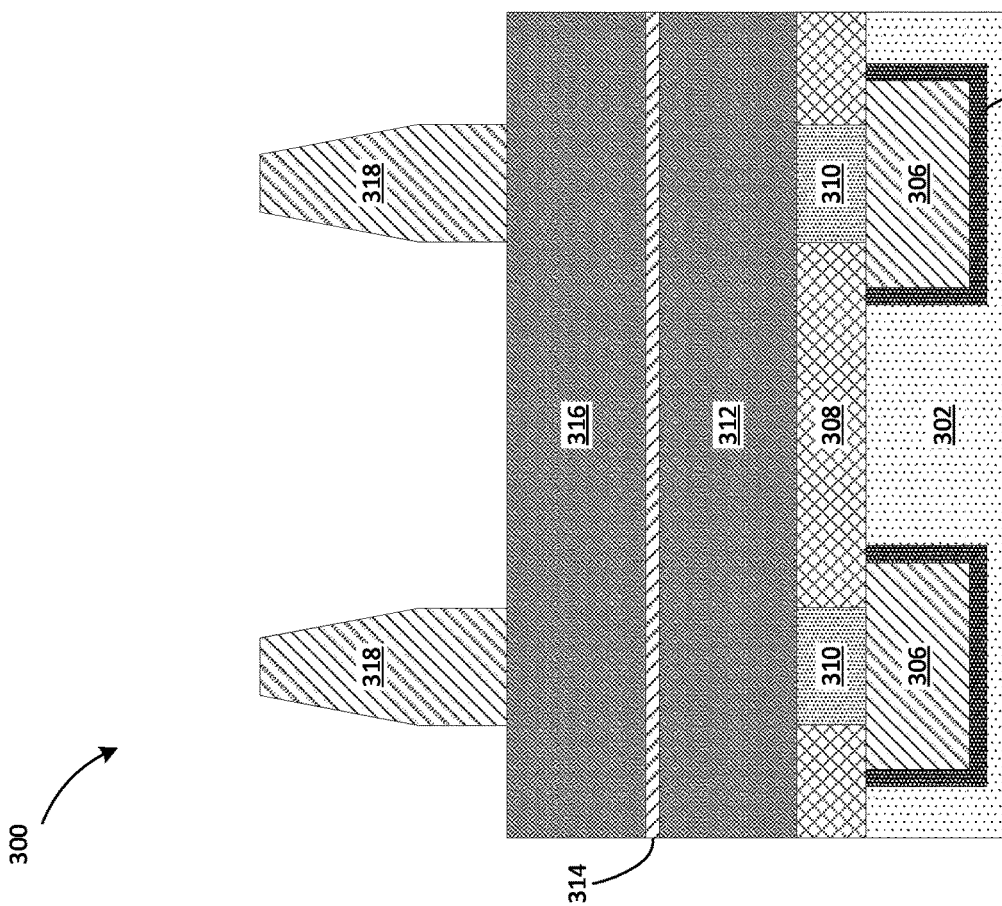
FIG. 22 is a cross-sectional view of the semiconductor device of FIG. 21 after additional fabrication operations, according to embodiments.

Referring now to FIG. 22, this figure is a cross-sectional view of the semiconductor device 300 including the MRAM of FIG. 21 after additional fabrication operations, according to embodiments. As shown in FIG. 22, after the corner etching of the top portion of the first hardmask layer 318, the SOG layer 323 is completely removed with any suitable wet or dry etching technique(s). Thus, the SOG layer 323 is a sacrificial layer that is used temporarily in order to allow for the creation of the tapered profile of the first hardmask layer 318, and then it is removed.

Figure 23:
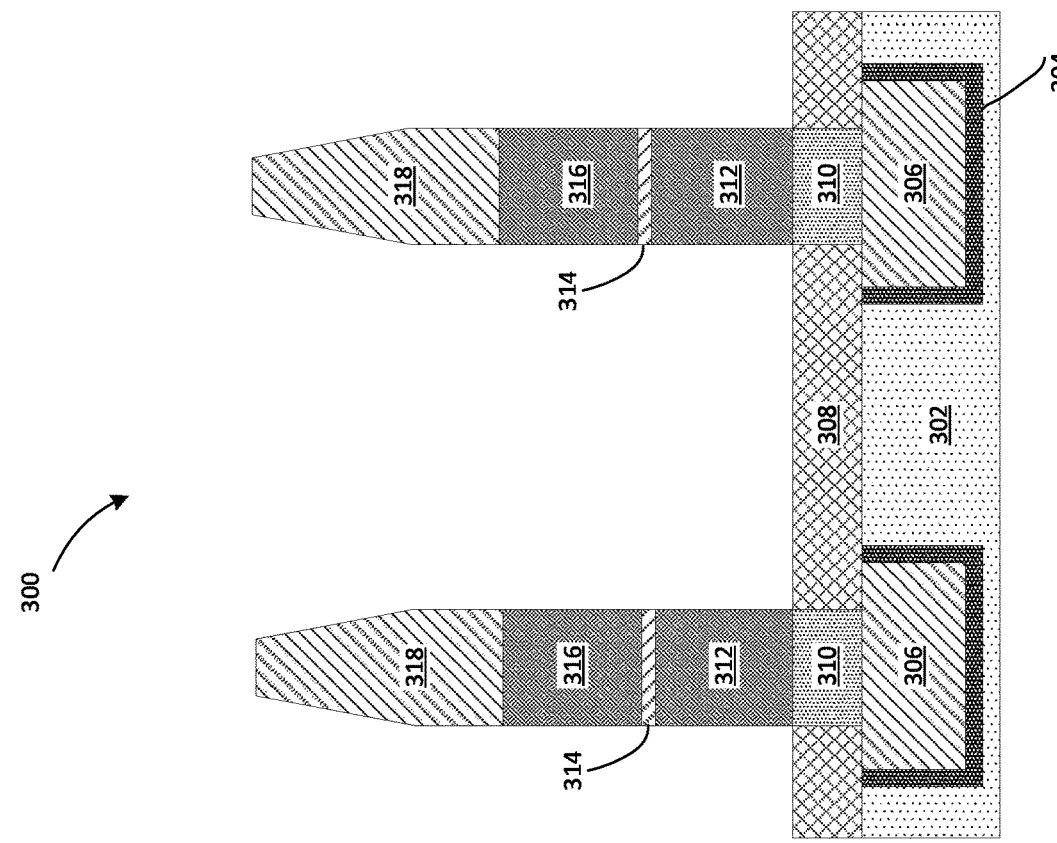
FIG. 23 is a cross-sectional view of the semiconductor device of FIG. 22 after additional fabrication operations, according to embodiments.

Referring now to FIG. 23, this figure is a cross-sectional view of the semiconductor device 300 including the MRAM of FIG. 22 after additional fabrication operations, according to embodiments. As shown in FIG. 23, after the removal of the SOG layer 323 described above with respect to FIG. 22, the magnetic tunnel junction (MTJ) stack (i.e., the reference layer 312, the tunnel barrier layer 314, and the magnetic free layer 316) is etched to create the MTJ pillars.

Figure 24:
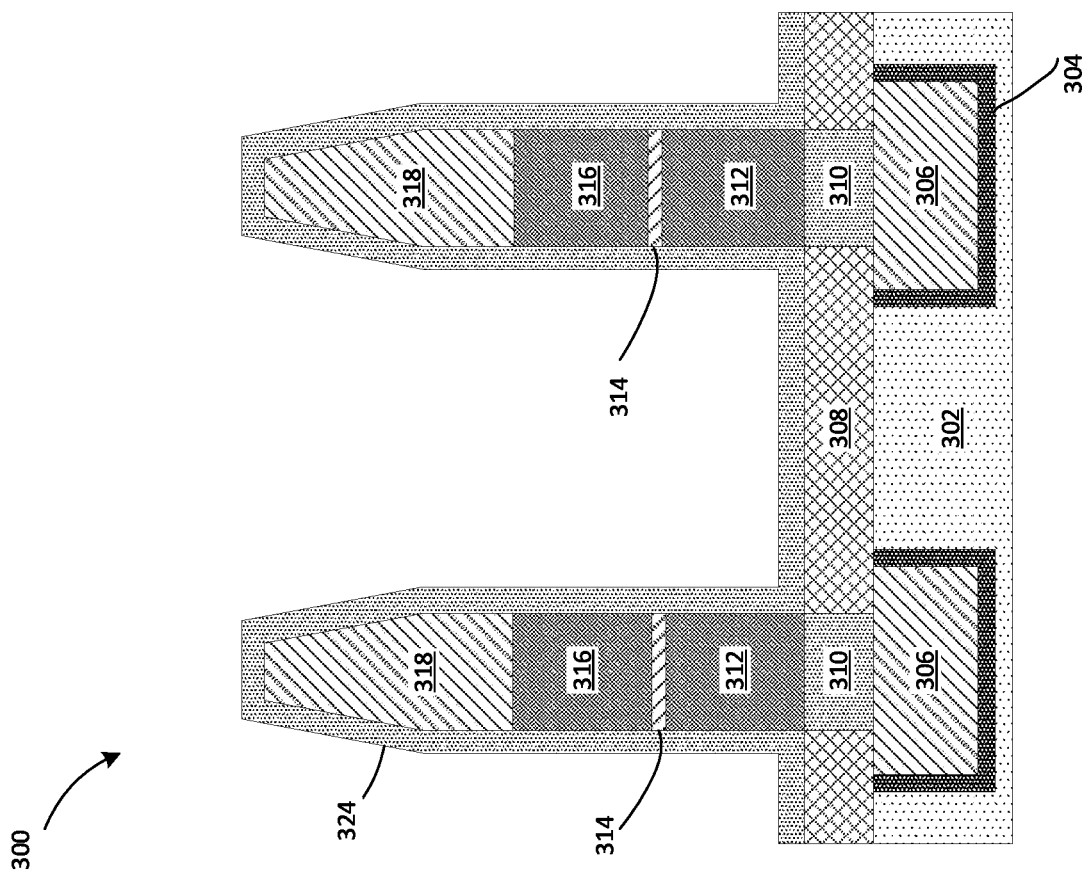
FIG. 24 is a cross-sectional view of the semiconductor device of FIG. 23 after additional fabrication operations, according to embodiments.

Referring now to FIG. 24, this figure is a cross-sectional view of the semiconductor device 300 including the MRAM of FIG. 23 after additional fabrication operations, according to embodiments. As shown in FIG. 24, after the MTJ stack patterning operations are performed, a dielectric encapsulation layer 324 is deposited over the entire surface of the semiconductor device 300. The dielectric encapsulation layer 324 may comprise, for example, SiN. One purpose of the dielectric encapsulation layer 324 is to isolate the tunnel barrier layer 314 from the outside environment. In certain examples, the formation of the dielectric encapsulation layer 324 is followed by the formation of an interlayer dielectric layer (ILD) which may be an oxide based dielectric material that may be formed by an aggressive deposition process. Thus, the dielectric encapsulation layer 324 may help protect the tunnel barrier layer 314 from damage during such a process.

Figure 25:
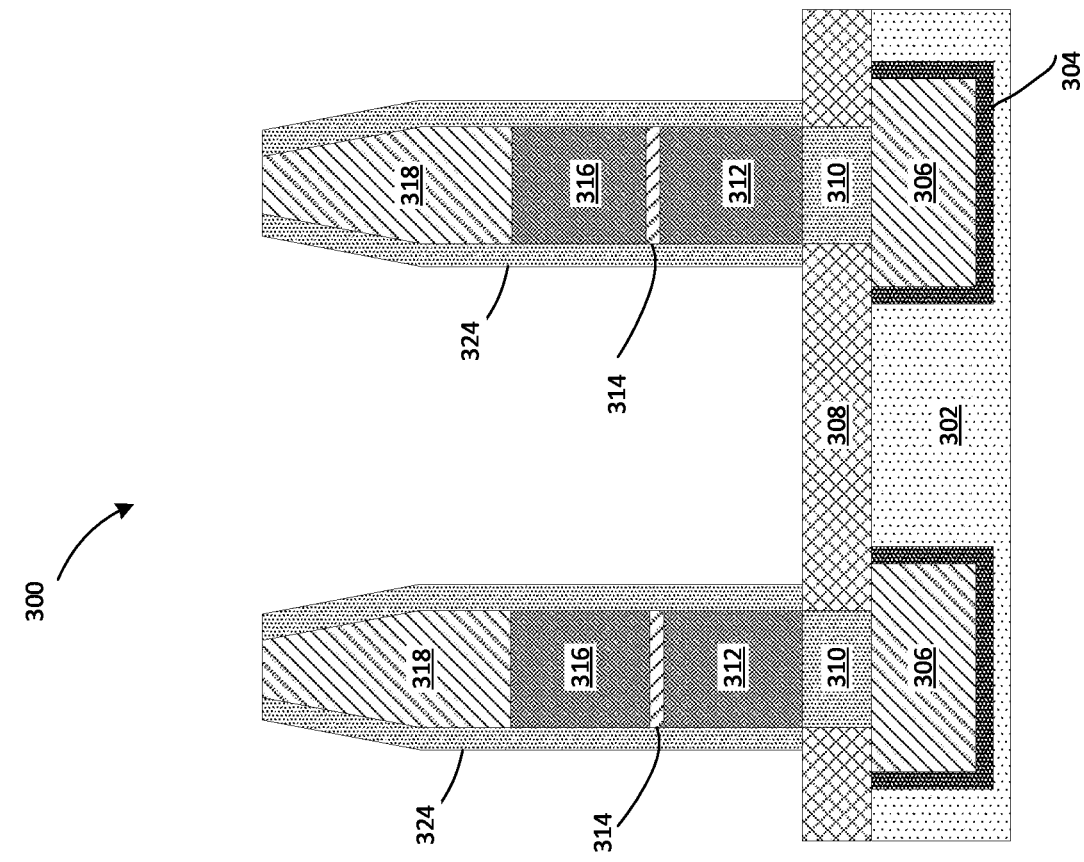
FIG. 25 is a cross-sectional view of the semiconductor device of FIG. 24 after additional fabrication operations, according to embodiments.

Referring now to FIG. 25, this figure is a cross-sectional view of the semiconductor device 300 including the MRAM of FIG. 24 after additional fabrication operations, according to embodiments. As shown in FIG. 25, after the conformal deposition of the dielectric encapsulation layer 324, horizontal portions thereof are removed. The removal of these portions of the dielectric encapsulation layer 324 expose the upper surfaces of the first hardmask layer 318 and the insulating material of the bottom electrode layer 308.

Figure 26:
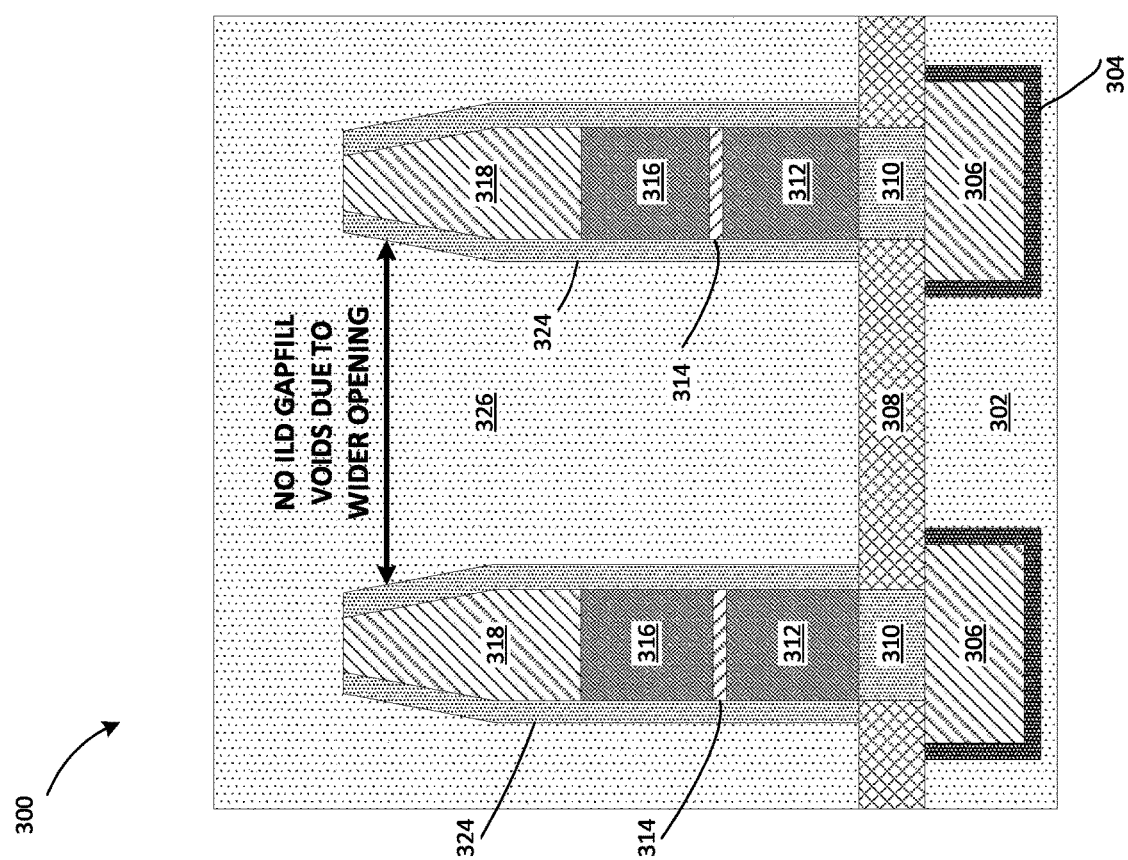
FIG. 26 is a cross-sectional view of the semiconductor device of FIG. 25 after additional fabrication operations, according to embodiments.

Referring now to FIG. 26, this figure is a cross-sectional view of the semiconductor device including the MRAM of FIG. 25 after additional fabrication operations, according to embodiments. As shown in FIG. 26, after the removal of the portions of the dielectric encapsulation layer 324, a second ILD layer 326 is deposited between the MTJ pillars. The second ILD layer 326 may be a low-κ material or any other suitable ILD material known to a person of skill in the art. As noted in FIG. 26, due to the tapering of the upper portions of the first hardmask layer 318, there is a wider opening between adjacent MRAM devices. This wider opening may facilitate the deposition of the second ILD layer 326 without forming voids between the devices. Thus, there may be the effect that there are less voids and consequently less electrical shorting between devices.

Figure 27:
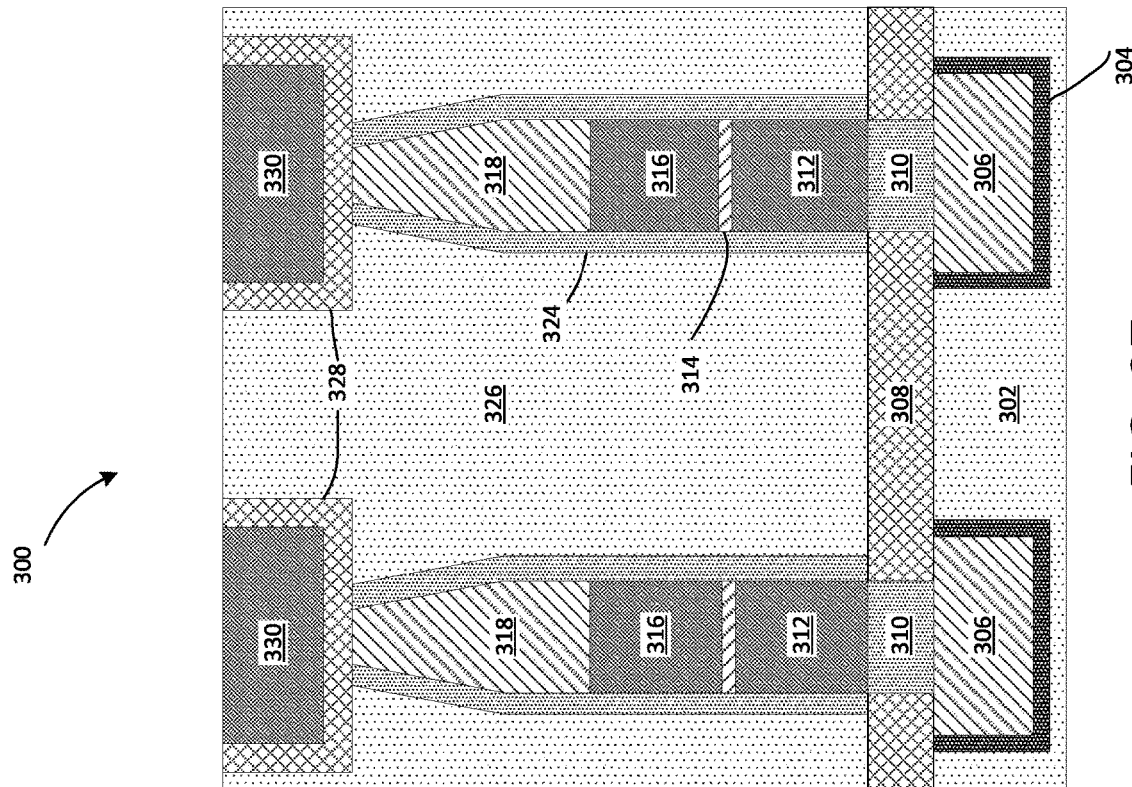
FIG. 27 is a cross-sectional view of the semiconductor device of FIG. 26 after additional fabrication operations, according to embodiments.

Referring now to FIG. 27, this figure is a cross-sectional view of the semiconductor device 300 including the MRAM of FIG. 26 after additional fabrication operations, according to embodiments. In certain embodiments, a combined via interconnect structure (e.g., a top metal liner layer 328 and a top metal layer 330) represents a top contact for coupling to the first hardmask layer 318. The top contact may be comprised of any suitable conducting materials and may be the same as or different from the bottom contact (i.e., the metal liner layer 304 and the metal layer 306).

Thus, in the embodiments described above, various structural alterations are performed to the hardmask layer to allow for a wider opening prior to ILD material deposition. These wider openings may allow for easier deposition of the ILD material and may reduce or eliminate the occurrence of voids, thereby minimizing the potential for electrical shorting between adjacent MRAM devices. It should be appreciated that other structural modifications may be made to the upper portions of the MRAM stacks in order to allow for a wider opening for ILD deposition. In a broad sense, any modification may be considered where a horizontal distance between inner edges of the hardmask structure is greater than a distance between the MRAM stack (i.e., the reference layer, the tunnel barrier layer, and the magnetic free layer).

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a magnetic random-access memory (MRAM) device, the method comprising:
    forming a first electrode;
    forming an MRAM stack having a vertical sidewall profile on the first electrode;
    forming a hardmask structure on the MRAM stack;
    forming a second electrode on the hardmask structure; and
    forming an interlayer dielectric (ILD) layer formed around the MRAM stack and the hardmask structure,
    wherein a width of the ILD layer at a level of the hardmask structure is greater than a width of the ILD layer at a level of the MRAM stack.

2. The method according to claim 1, wherein a width of an upper portion of the hardmask structure is less than a width of the MRAM stack.

3. The method according to claim 1, wherein the hardmask structure includes
    a first hardmask layer comprising a first material composition, and
    a second hardmask layer formed on the first hardmask layer and comprising a second material composition, the first material composition being different than the second material composition,
    wherein the second hardmask layer has a width that is less than that of the first hardmask layer.

4. The method according to claim 3, further comprising forming a tapered portion of the first hardmask layer that extends from an upper surface of the first hardmask layer.

5. The method according to claim 4, wherein the tapered portion has a taper angle ranging from 5 to 45 degrees relative to a vertical direction of the MRAM device.

6. The method according to claim 4, wherein forming the tapered portion of the first hardmask layer includes:
    forming the first hardmask layer and the second hardmask layer to a same width;
    removing material of the second hardmask layer so that the second hardmask layer has a width less than that of the first hardmask layer;

depositing a spin on glass (SOG) layer on the MRAM stack, the SOG layer having a height that is less than a height of the first hardmask layer;

removing material of the first hardmask layer to form the tapered portion of the first hardmask layer, the tapered portion extending from an upper surface of the first hardmask layer to an upper surface of the SOG layer; and removing the SOG layer.

7. The method according to claim 1, wherein the first hardmask layer/second hardmask layer include a combination of materials selected from the group consisting of: TaN/WCN; TiN/WCN; TaAlN/WN; and TiAlN/WN.

8. The method according to claim 1, wherein forming the hardmask structure includes forming a first hardmask layer having a tapered portion of the first hardmask layer that extends from an upper surface of the first hardmask layer.

9. The method according to claim 8, wherein tapered portion of the first hardmask layer is formed with a reactive ion etching (RIE) process.

10. The method according to claim 9, wherein the RIE process includes ion bombardment.

11. The method according to claim 8, wherein forming the tapered portion of the first hardmask layer includes:

forming the first hardmask layer on the MRAM stack;

depositing a spin on glass (SOG) layer on the MRAM stack around the first hardmask layer, the SOG layer having a height that is less than a height of the first hardmask layer;

removing material of the first hardmask layer to form the tapered portion of the first hardmask layer, the tapered portion extending from an upper surface of the first hardmask layer to an upper surface of the SOG layer; and removing the SOG layer.

12. The method according to claim 1, wherein forming the MRAM stack includes forming a reference layer, forming a tunnel barrier layer on the reference layer, and forming a magnetic free layer on the reference layer.

13. The method according to claim 1, further comprising forming a dielectric encapsulation layer around the MRAM stack.

14. A magnetic random-access memory (MRAM) device comprising:

a first electrode;

an MRAM stack having a vertical sidewall profile formed on the first electrode;

a hardmask structure formed on the MRAM stack;

a second electrode formed on the hardmask structure; and an interlayer dielectric (ILD) layer formed around the MRAM stack and the hardmask structure, wherein a width of the ILD layer at a level of the hardmask structure is greater than a width of the ILD layer at a level of the MRAM stack.

15. The MRAM device according to claim 14, wherein a width of an upper portion of the hardmask structure is less than a width of the MRAM stack.

16. The MRAM device according to claim 14, wherein the hardmask structure includes a first hardmask layer comprising a first material composition, and a second hardmask layer formed on the first hardmask layer and comprising a second material composition, the first material composition being different than the second material composition, wherein the second hardmask layer has a width that is less than that of the first hardmask layer.

17. The MRAM device according to claim 16, wherein the first hardmask layer includes a tapered portion that extends from an upper surface of the first hardmask layer.

18. The MRAM device according to claim 17, wherein the tapered portion has a taper angle ranging from 5 to 45 degrees relative to a vertical direction of the MRAM device.

19. The MRAM device according to claim 14, further comprising a dielectric encapsulation layer formed around the MRAM stack.

20. The MRAM device according to claim 14, wherein the hardmask structure includes a combination of materials selected from the group consisting of: TaN/WCN; TiN/WCN; TaAlN/WN; and TiAlN/WN.

21. The MRAM device according to claim 14, wherein the hardmask structure includes a first hardmask layer having a tapered portion of the first hardmask layer that extends from an upper surface of the first hardmask layer.

22. The MRAM device according to claim 21, wherein the tapered portion of the first hardmask layer is formed with a reactive ion etching (RIE) process.

23. The MRAM device according to claim 22, wherein the RIE process includes ion bombardment.

24. The MRAM device according to claim 14, further comprising a top contact formed on the hardmask structure.

25. The MRAM device according to claim 14, wherein the MRAM stack includes a reference layer, a tunnel barrier layer on the reference layer, and a magnetic free layer on the reference layer.

* * * * *